United States Patent
Choi et al.

(10) Patent No.: US 11,798,629 B2
(45) Date of Patent: Oct. 24, 2023

(54) NONVOLATILE MEMORY DEVICE, STORAGE DEVICE, AND OPERATING METHOD OF NONVOLATILE MEMORY DEVICE

(71) Applicant: SAMSUNG ELECTRONICS CO., LTD., Suwon-si (KR)

(72) Inventors: Yonghyuk Choi, Suwon-si (KR); Jae-Duk Yu, Seoul (KR); Kang-Bin Lee, Suwon-si (KR); Sang-Won Shim, Seoul (KR); Bongsoon Lim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 17/489,988

(22) Filed: Sep. 30, 2021

(65) Prior Publication Data
US 2022/0020434 A1   Jan. 20, 2022

Related U.S. Application Data

(63) Continuation of application No. 16/935,535, filed on Jul. 22, 2020, now Pat. No. 11,158,379, which is a
(Continued)

(30) Foreign Application Priority Data

Aug. 26, 2019   (KR) .................. 10-2019-0104615

(51) Int. Cl.
*G11C 7/14*      (2006.01)
*G11C 16/10*     (2006.01)
(Continued)

(52) U.S. Cl.
CPC .......... *G11C 16/10* (2013.01); *G11C 16/0483* (2013.01); *G11C 16/08* (2013.01);
(Continued)

(58) Field of Classification Search
CPC ........................................ G11C 7/14
(Continued)

(56) References Cited

U.S. PATENT DOCUMENTS 7,679,133 B2    3/2010   Son et al.
8,553,466 B2    10/2013  Han et al.
(Continued)

FOREIGN PATENT DOCUMENTS

KR    10-2012-0133232    12/2012

OTHER PUBLICATIONS

Notice of Allowance dated Feb. 22, 2021 in Corresponding U.S. Appl. No. 16/851,622.
(Continued)

*Primary Examiner* — Jason Lappas
(74) *Attorney, Agent, or Firm* — F. Chau & Associates, LLC

(57) ABSTRACT

Each of memory blocks of a nonvolatile memory device includes a memory cell region including first metal pads, first memory cells of a first portion of pillar, and second memory cells of a second portion of the pillar, and a peripheral circuit region including second metal pads, a row decoder, and a page buffer. When performing program operations based on consecutive addresses at a memory block selected from the memory blocks, the nonvolatile memory device sequentially completes first program operations of non-adjacent memory cells not adjacent to a boundary of the first portion and the second portion from among the first and second memory cells and then completes a second program operation of an adjacent memory cell adjacent to the boundary. The peripheral circuit region is vertically connected to the memory cell region by the first metal pads and the second metal pads directly.

20 Claims, 16 Drawing Sheets

Related U.S. Application Data continuation-in-part of application No. 16/851,622, filed on Apr. 17, 2020, now Pat. No. 11,043,274.

(51) Int. Cl.
| | |
|---|---|
| *G11C 16/08* | (2006.01) |
| *G11C 16/34* | (2006.01) |
| *H01L 25/065* | (2023.01) |
| *H01L 25/18* | (2023.01) |
| *H01L 23/00* | (2006.01) |
| *G11C 16/04* | (2006.01) |
| *H10B 41/27* | (2023.01) |
| *H10B 43/27* | (2023.01) |

(52) U.S. Cl.
CPC .......... *G11C 16/349* (2013.01); *H01L 24/05* (2013.01); *H01L 24/08* (2013.01); *H01L 25/0657* (2013.01); *H01L 25/18* (2013.01); *H10B 41/27* (2023.02); *H10B 43/27* (2023.02); *H01L 2224/05147* (2013.01); *H01L 2224/08145* (2013.01); *H01L 2924/1431* (2013.01); *H01L 2924/14511* (2013.01)

(58) Field of Classification Search
USPC ...................................... 365/210.1
See application file for complete search history.

(56) References Cited

U.S. PATENT DOCUMENTS

| | | |
|---|---|---|
| 8,557,695 B2 | 10/2013 | Mizukami et al. |
| 8,559,235 B2 | 10/2013 | Yoon et al. |
| 8,654,587 B2 | 2/2014 | Yoon et al. |
| 8,976,584 B2 | 3/2015 | Han et al. |
| 9,214,238 B2 | 12/2015 | Futatsuyama et al. |
| 9,449,987 B1 | 9/2016 | Miyata et al. |
| 10,043,817 B2 | 8/2018 | Lee et al. |
| 10,672,791 B2 | 6/2020 | Lim et al. |
| 10,930,661 B2 | 2/2021 | Chen et al. |
| 11,043,274 B2 | 6/2021 | Choi et al. |
| 2011/0233648 A1 | 9/2011 | Seol et al. |
| 2016/0027525 A1 | 1/2016 | Kim et al. |
| 2016/0099047 A1 | 4/2016 | Lee |
| 2018/0374541 A1 | 12/2018 | Jung et al. |
| 2019/0171381 A1* | 6/2019 | Ioannou ................ G06F 3/0679 |
| 2019/0172544 A1 | 6/2019 | Kim et al. |
| 2020/0194668 A1 | 6/2020 | Sato |
| 2021/0065805 A1 | 3/2021 | Choi et al. |
| 2021/0065806 A1 | 3/2021 | Choi et al. |

OTHER PUBLICATIONS

Notice of Allowance dated Jun. 24, 2021 in Corresponding U.S. Appl. No. 16/935,535.

* cited by examiner

FIG. 8

| Word Lines | 4th Scheme | 5th Scheme | 6th Scheme | 7th Scheme | 8th Scheme | 9th Scheme |
|---|---|---|---|---|---|---|
| WL10 | | | ←— S331 | ←— S341 | —→ S351 | —→ S361 |
| WL9 | ↓ S311 | ↓ S321 | ↓ S334 | ↓ S343 | ↓ S354 | ↓ S363 |
| WL8 | ←— S314 | ↓ S323 | ↓ S334 | ↓ S343 | ↓ S354 | ↓ S363 |
| WL7 | | | | | | |
| WL6 | —→ S312 | —→ S322 | —→ S332 | —→ S342 | —→ S352 | —→ S362 |
| WL5 | | | | | | |
| WL4 | ↓ S315 | ↓ S325 | ↓ S335 | ↓ S345 | ↓ S355 | ↓ S365 |
| WL3 | ↓ S313 | ↓ S324 | ↓ S333 | ↓ S344 | ↓ S353 | ↓ S364 |
| WL2 | | | | | | |
| WL1 | | | | | | |

FIG. 13

| Word Lines | 16th Scheme | 17th Scheme | 18th Scheme |
|---|---|---|---|
| WL10 | ← S571 | ← S581 | ← S591 |
| WL9 | ← S572<br>← S576 | ← S582<br>← S584 | ← S592<br>← S595 |
| WL8 | | | |
| WL7 | S573 ↓ | S583 ↓ | S593 ↓ |
| WL6 | | | |
| WL5 | | | |
| WL4 | ← S574<br>← S577 | ← S585<br>← S587 | ← S594<br>← S597 |
| WL3 | | | |
| WL2 | S575 ↓ | S586 ↓ | S596 ↓ |
| WL1 | | | |

NONVOLATILE MEMORY DEVICE, STORAGE DEVICE, AND OPERATING METHOD OF NONVOLATILE MEMORY DEVICE

CROSS-REFERENCE TO RELATED APPLICATIONS

This U.S. non-provisional patent application is a continuation application of U.S. patent application Ser. No. 16/935,535 filed Jul. 22, 2020, which is a continuation-in-part application of U.S. non-provisional patent application Ser. No. 16/851,622 filed on Apr. 17, 2020, issued as U.S. Pat. No. 11,043,274 on Jun. 22, 2021, which claims priority under 35 U.S.C. § 119 to Korean Patent Application No. 10-2019-0104615 filed on Aug. 26, 2019, in the Korean Intellectual Property Office, the disclosures of which are incorporated by reference in their entirety herein.

BACKGROUND

1. Technical Field

Embodiments of the inventive concept described herein relate to a semiconductor circuit, and more particularly, relate to a nonvolatile semiconductor memory, a storage device, and an operating method of the nonvolatile memory device.

2. Discussion of Related Art

A nonvolatile memory device is a type of memory capable of retaining stored data even when power is turned off. Examples of nonvolatile memory devices include a read only memory (ROM), a programmable ROM (PROM), an electrically programmable ROM (EPROM), an electrically erasable and programmable ROM (EEPROM), a flash memory, a phase-change memory (PRAM), a magnetic memory (MRAM), a resistive memory (RRAM), and a ferroelectric RAM (FRAM).

A capacity of the nonvolatile memory device may be increased by arranging memory cells of the device into three-dimensional stacks. However, the reliability of some memory cells in the three-dimensional stacks have a lower reliability than other memory cells in the three-dimensional stacks.

When data is not written in the memory cells of the low reliability, the capacity of the nonvolatile memory device decreases. When data is written in the memory cells of the low reliability, the probability of a data loss increases.

SUMMARY

At least one exemplary embodiment of the inventive concept provides a nonvolatile memory device, a storage device, and an operating method of the nonvolatile memory device, which are capable of performing program operations increasing the reliability of data written in memory cells of low reliability.

According to an exemplary embodiment of the inventive concept, a nonvolatile memory device includes a memory cell region including first metal pads and a memory cell array, and a peripheral circuit region including second metal pads, a row decoder, and a page buffer. The memory cell array is disposed on a substrate. The memory cell array includes memory blocks. The row decoder is connected to the memory cell array through word lines, and the page buffer block is connected to the memory cell array through bit lines. Each of the memory blocks includes a pillar having a first portion disposed on the substrate and a second portion stacked on the first portion. A width of the first portion increases as a distance from the substrate increases, and first conductive materials and first insulating layers surround the first portion and are stacked in turn on the substrate. A width of the second portion increases as a distance from the substrate increases, and second conductive materials and second insulating layers surround the second portion and are stacked in turn on the substrate. A first boundary is located between the first portion and the second portion. The first conductive materials form first memory cells together with the first portion and the second conductive materials form second memory cells together with the second portion. When performing program operations based on consecutive addresses in a selected memory block of the memory blocks, the row decoder and the page buffer are configured to complete a second program operation of an adjacent memory cell adjacent to the first boundary after sequentially completing first program operations of non-adjacent memory cells not adjacent to the first boundary from among the first and second memory cells. The peripheral circuit region is vertically connected to the memory cell region by the first metal pads and the second metal pads directly.

According to an exemplary embodiment of the inventive concept, a storage device includes a nonvolatile memory device including memory cell region and a peripheral circuit region, and a controller that controls a write operation for a selected memory block of the memory blocks of the nonvolatile memory device. The memory cell region includes first metal pads and a plurality of memory blocks. The peripheral circuit region includes second metal pads. Each of the memory blocks includes first memory cells corresponding to a first portion of a pillar extending in a direction perpendicular to a substrate, and second memory cells corresponding to a second portion of the pillar extending in the direction perpendicular to the substrate and disposed on the first portion. The first memory cells and the second memory cells are classified into at least one first adjacent memory cell adjacent to a first boundary between the first portion and the second portion and first non-adjacent memory cells being remaining memory cells other than the at least one first adjacent memory cell. In the write operation of the selected memory block, the controller controls the nonvolatile memory device such that the number of bits to be written in the at least one first adjacent memory cell is smaller than the number of bits to be written in each of the first non-adjacent memory cells when program operations of the first memory cells and the second memory cells are completed. The peripheral circuit region is vertically connected to the memory cell region by the first metal pads and the second metal pads directly.

According to an exemplary embodiment of the inventive concept, an operating method of a nonvolatile memory device which includes a memory cell region and a peripheral circuit region, the memory cell region including first metal pads and memory cells connected in series between a string selection transistor and a ground selection transistor. The peripheral circuit region includes second metal pads. The operating method includes completing first program operations of first memory cells of the memory cells, and completing a second program operation of at least one second memory cell located between the first memory cells, after completing the first program operations of the first memory cells. The memory cells are stacked in a direction perpendicular to a substrate, based on a first portion of a pillar extending in the direction perpendicular to the substrate and a second portion of the pillar extending in the direction perpendicular to the substrate and disposed on the first portion. The at least one second memory cell is adjacent to a boundary between the first portion and the second portion. The peripheral circuit region is vertically connected to the memory cell region by the first metal pads and the second metal pads directly.

BRIEF DESCRIPTION OF THE FIGURES

The inventive concept will become apparent by describing in detail exemplary embodiments thereof with reference to the accompanying drawings.

FIG. 8 illustrates examples in which a nonvolatile memory device performs program operations in a memory block of FIG. 7.

FIGS. 12 and 13 illustrate examples in which a nonvolatile memory device performs program operations depending on an operating method of FIG. 9.

DETAILED DESCRIPTION OF THE EXEMPLARY EMBODIMENTS

Below, embodiments of the inventive concept are described in detail and clearly to such an extent that one of ordinary skill in the art can implement the inventive concept.

Figure 1:
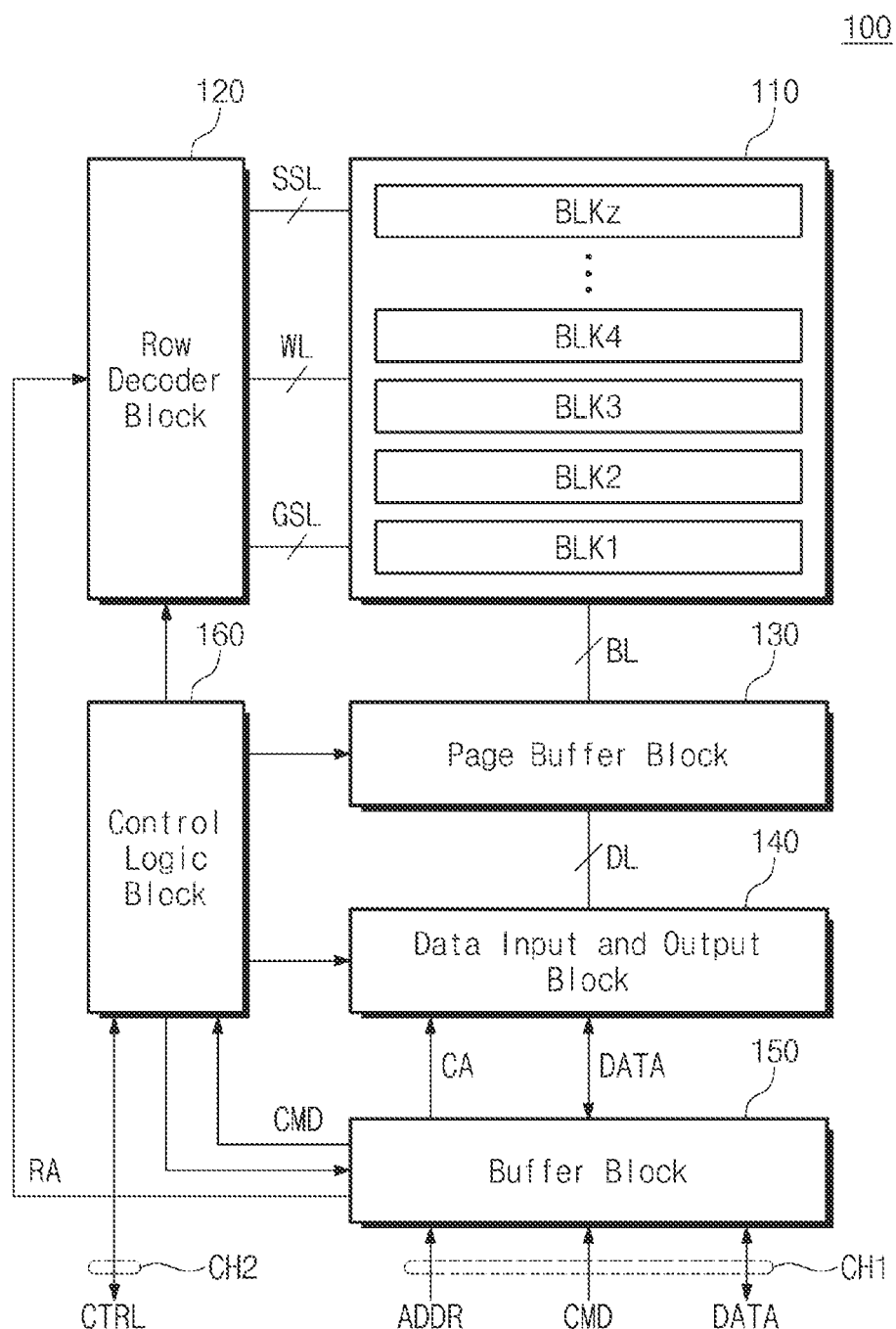
FIG. 1 is a block diagram illustrating a nonvolatile memory device according to an exemplary embodiment of the inventive concept.

FIG. 1 is a block diagram illustrating a nonvolatile memory device 100 according to an embodiment of the inventive concept. Referring to FIG. 1, the nonvolatile memory device 100 includes a memory cell array 110, a row decoder block 120 (e.g., a row decoding circuit), a page buffer block 130 (e.g., one or more page buffers), a data input and output block 140 (e.g., an input/output circuit), a buffer block 150 (e.g., one or more buffers), and a control logic block 160 (e.g., a control circuit).

The memory cell array 110 includes a plurality of memory blocks BLK1 to BLKz. Each of the memory blocks BLK1 to BLKz includes a plurality of memory cells. Each of the memory blocks BLK1 to BLKz may be connected to the row decoder block 120 through at least one ground selection line GSL, word lines WL, and at least one string selection line SSL. Some of the word lines WL may be used as dummy word lines. Each memory block may be connected to the page buffer block 130 through a plurality of bit lines BL. The plurality of memory blocks BLK1 to BLKz may be connected in common to the plurality of bit lines BL.

In an embodiment, each of the plurality of memory blocks BLK1 to BLKz corresponds to a unit of an erase operation. The memory cells belonging to each memory block may be erased at the same time. In another example, each of the plurality of memory blocks BLK1 to BLKz may be divided into a plurality of sub-blocks. Each of the plurality of sub-blocks may correspond to a unit of the erase operation.

The row decoder block 120 is connected to the memory cell array 110 through ground selection lines GSL, the word lines WL, and string selection lines SSL. The row decoder block 120 operates under control of the control logic block 160.

The row decoder block 120 may decode a row address RA received from the buffer block 150 and may control voltages to be applied to the string selection lines SSL, the word lines WL, and the ground selection lines GSL based on the decoded row address.

The page buffer block 130 is connected to the memory cell array 110 through the plurality of bit lines BL. The page buffer block 130 is connected with the data input and output block 140 through a plurality of data lines DL. The page buffer block 130 operates under control of the control logic block 160.

In a write operation, the page buffer block 130 may store data to be written in memory cells. The page buffer block 130 may apply voltages to the plurality of bit lines BL based on the stored data. In a read operation or in a verify read operation that is performed in the write operation or an erase operation, the page buffer block 130 may sense voltages of the bit lines BL to generate a sensing result and may store the sensing result.

The data input and output block 140 is connected with the page buffer block 130 through the plurality of data lines DL. The data input and output block 140 may receive a column address CA from the buffer block 150. The data input and output block 140 may output data read by the page buffer block 130 to the buffer block 150 depending on the column address CA. The data input and output block 140 may provide data received from the buffer block 150 to the page buffer block 130, based on the column address CA.

The buffer block 150 may receive a command CMD and an address ADDR from an external device through a first channel CH1 and may exchange data "DATA" with the external device. The buffer block 150 may operate under control of the control logic block 160. The buffer block 150 may transfer the command CMD to the control logic block 160. The buffer block 150 may transfer the row address RA of the address ADDR to the row decoder block 120 and may transfer the column address CA of the address ADDR to the data input and output block 140. The buffer block 150 may exchange the data "DATA" with the data input and output block 140.

The control logic block 160 may exchange a control signal CTRL from the external device through a second channel CH2. The control logic block 160 may control the buffer block 150 to route the command CMD, the address ADDR, and the data "DATA".

The control logic block 160 may decode the command CMD received from the buffer block 150 and may control the nonvolatile memory device 100 depending on the decoded command. In an exemplary embodiment of the inventive concept, the control logic block 160 specifies an order of program operations, in which the row decoder block 120 and the page buffer block 130 program memory cells, based on differences of structures and distinct characteristics of the memory cells.

Figure 2:
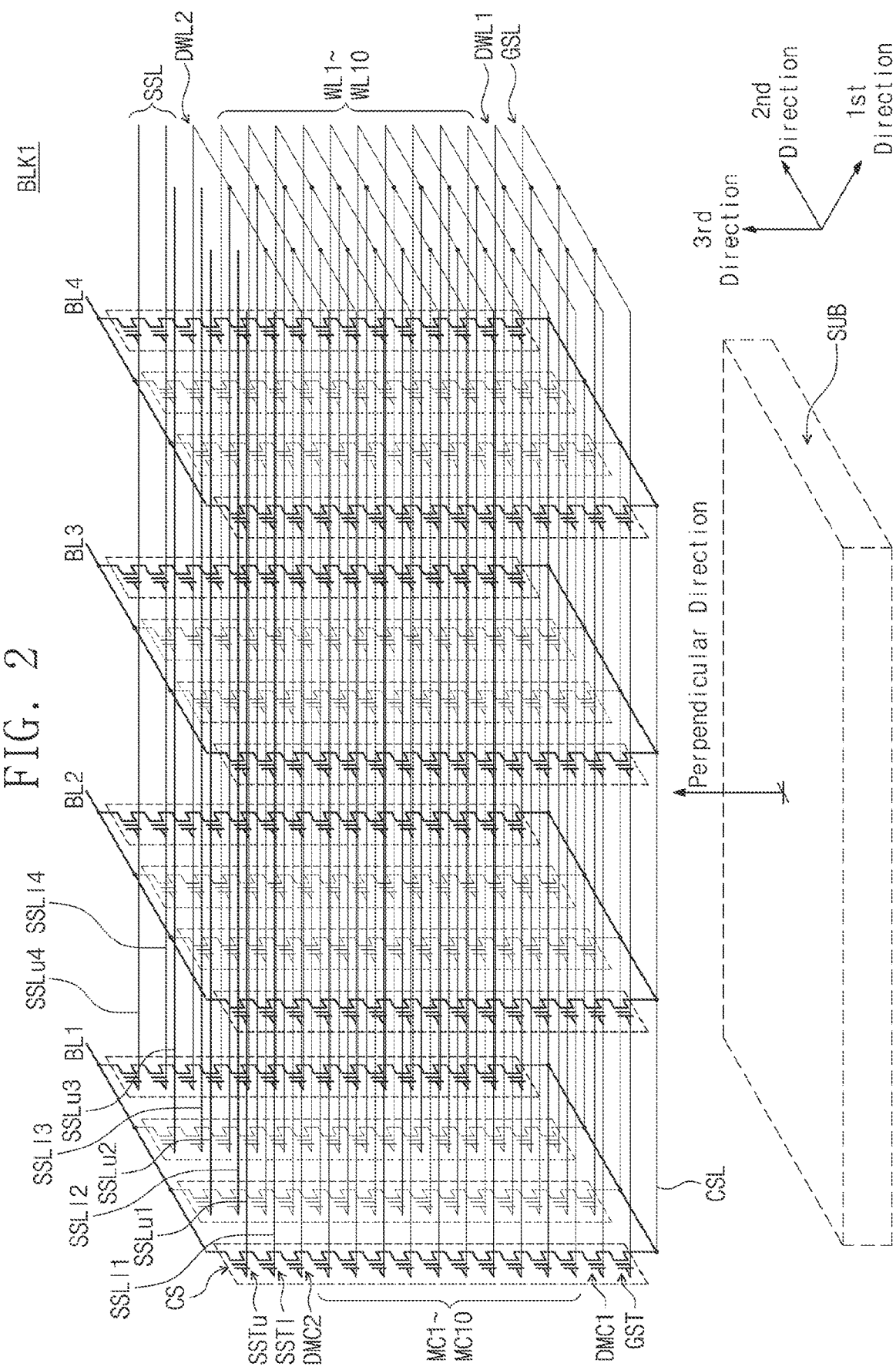
FIG. 2 illustrates an example of one memory block according to an exemplary embodiment of the inventive concept.

FIG. 2 illustrates an example of one memory block BLK1 according to an exemplary embodiment of the inventive concept. Referring to FIG. 2, a plurality of cell strings CS are arranged on a substrate SUB in a first direction, a second direction, and a third direction. The plurality of cell strings CS may be connected in common to a common source line CSL formed on (or in) the substrate SUB. In FIG. 2, a location of the substrate SUB is illustrated to aid in understanding a structure of the memory block BLK1.

Cell strings of the rows may be connected in common to the ground selection line GSL, and cell strings of each row may be connected to a corresponding one of first to fourth upper string selection lines SSLu1 to SSLu4 and a corresponding one of first to fourth lower string selection lines SSL11 to SSL14. Cell strings of each column may be connected to a corresponding one of first to fourth bit lines BL1 to BL4. For brief illustration, cell strings connected to the second and third string selection lines SSL2$l$, SSL2$u$, SSL3$l$, and SSL3$u$ are depicted to be blurred.

Each cell string may include at least one ground selection transistor GST connected to the ground selection line GSL, a first dummy memory cell DMC1 connected to a first dummy word line DWL1, first to tenth memory cells MC1 to MC10 respectively connected to first to tenth word lines WL1 to WL10, a second dummy memory cell DMC2 connected to a second dummy word line DWL2, and lower and upper string selection transistors SST1 and SSTu respectively connected to the corresponding lower and upper string selection lines.

In each cell string, the ground selection transistor GST, the first dummy memory cell DMC1, the first to tenth memory cells MC1 to MC10, the second dummy memory cell DMC2, and the lower and upper string selection transistors SST1 and SSTu may be serially connected along a third direction perpendicular to the substrate SUB and may be sequentially stacked along the third direction perpendicular to the substrate SUB.

The memory block BLK1 may be provided as a 3D memory array. The 3D memory array is monolithically formed in one or more physical levels of arrays of memory cells MC having an active area disposed above the substrate SUB (e.g., silicon) and a circuit associated with the operation of those memory cells MC. The circuit associated with an operation of memory cells MC may be located above or within the substrate SUB. The term "monolithic" means that layers of each level of the array are directly deposited on the layers of each underlying level of the 3D memory array.

In an embodiment of the inventive concept, the 3D memory array includes vertical cell strings CS (or NAND strings) that are vertically oriented such that at least one memory cell is located over another memory cell. The at least one memory cell may include a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 3:
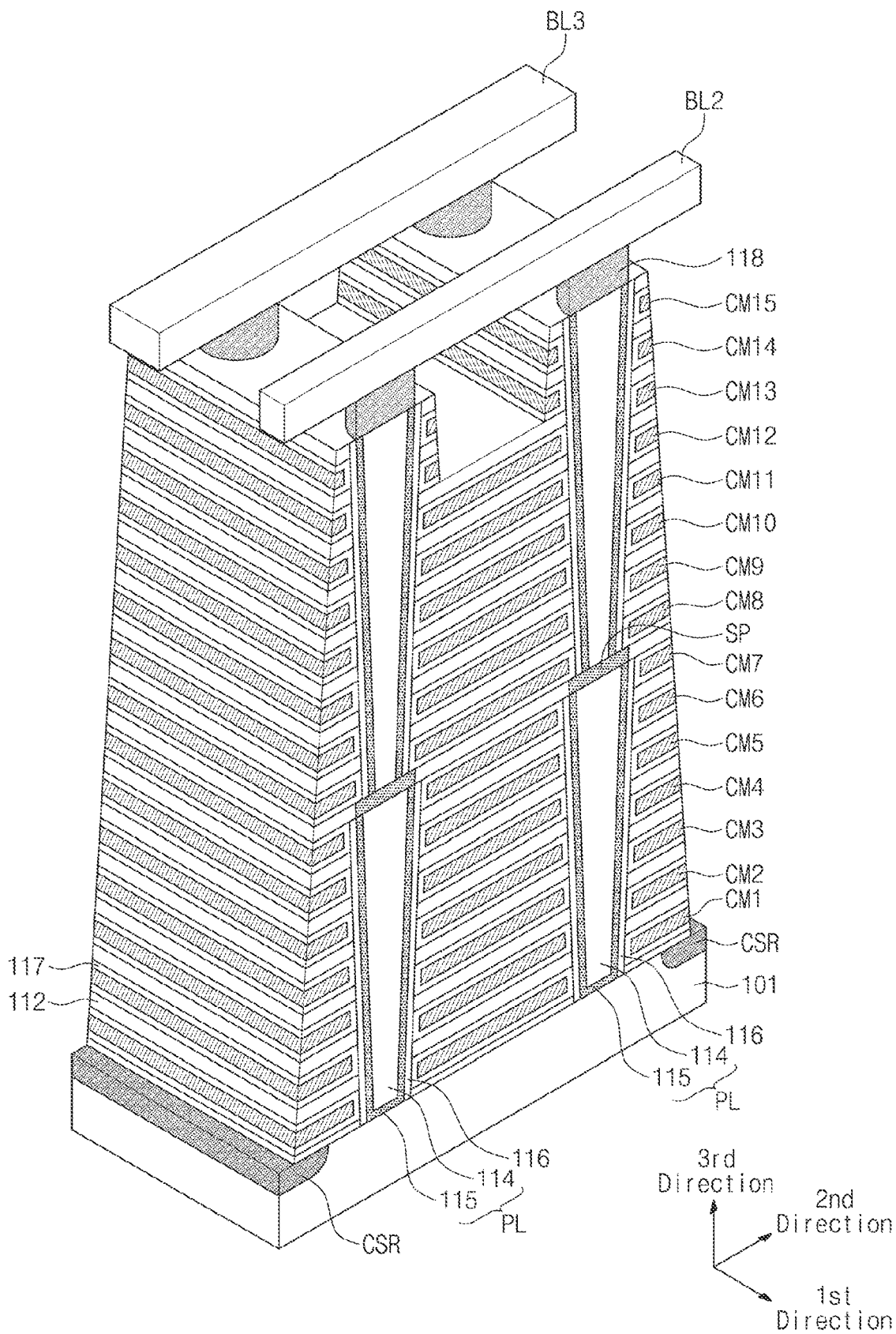
FIG. 3 is a perspective cross-sectional view illustrating an example of cell strings corresponding to second and third bit lines of a memory block of FIG. 2.

FIG. 3 is a perspective cross-sectional view illustrating an example of cell strings CS corresponding to the second and third bit lines BL2 and BL3 of the memory block BLK1 of FIG. 2. Referring to FIGS. 2 and 3, common source regions CSR that extend along a first direction and are spaced from each other along a second direction are disposed on the substrate SUB.

The common source regions CSR may be connected in common to form a common source line CSL. In an embodiment, a substrate 101 includes a P-type semiconductor material. The common source regions CSR may include an N-type semiconductor material. For example, a conductive material for increasing conductivity of the common source line CSL may be disposed on the common source region CSR.

Pillars PL are located between the common source regions CSR. In an exemplary embodiment, the pillars PL are perpendicular to the substrate 101 or parallel to the third direction. Each of the pillars PL includes an inner material 114, a channel layer 115, and a first insulating layer 116.

The inner material 114 may include an insulating material or an air gap. The channel layer 115 may include a P-type semiconductor material or an intrinsic semiconductor material. The first insulating layer 116 may include one or more of insulating layers (e.g., different insulating layers) such as a silicon oxide layer, a silicon nitride layer, and an aluminum oxide layer.

Insulating layers 112 and conductive materials CM1 to CM15 may be in turn stacked on the substrate 101 along the third direction perpendicular to the substrate 101, so as to surround the pillars PL. In an embodiment, the insulating layers 112 may include silicon oxide or silicon nitride.

A second insulating layer 117 may be located between the pillars PL and the conductive materials CM1 to CM15 and between the conductive materials CM1 to CM15 and the insulating layers 112. In each of the pillars PL, portions, which are adjacent to each other, of the first insulating layer 116 and the second insulating layer 117 may be coupled to form an information storage layer. For example, the first insulating layer 116 and the second insulating layer 117 may include an oxide-nitride-oxide (ONO) or oxide-nitride-alumina (ONA). The first insulating layer 116 and the second insulating layer 117 may form a tunneling insulating layer, a charge trap layer, or a blocking insulating layer.

Drains 118 are disposed on the pillars PL. In an embodiment, the drains 118 include an N-type semiconductor material (e.g., silicon). The bit lines BL2 and BL3 that extend along the second direction and are spaced from each other along the first direction are disposed on the drains 118. The bit lines BL2 and BL3 are connected with the drains 118.

The pillars PL form the cell strings CS together with the first and second insulating layers 116 and 117 and the conductive materials CM1 to CM15. Each of the pillars PL forms a cell string together with the first and second insulating layers 116 and 117 and the conductive materials CM1 to CM15, which are adjacent thereto. The first conductive material CM1 may form the ground selection transistors GST together with the first and second insulating layers 116 and 117 and the channel layers 115 adjacent thereto. The first conductive material CM1 may extend along the first direction to form the ground selection line GSL.

The second conductive material CM2 may form first dummy memory cells DMC1 together with the adjacent first and second insulating layers 116 and 117 and the channel layers 115. The second conductive material CM2 may extend along the first direction to form the first dummy word line DWL1.

The third to twelfth conductive materials CM3 to CM12 may form the first to tenth memory cells MC1 to MC10 together with adjacent layers, that is, the first and second insulating layers 116 and 117 and the channel layers 115. The third to twelfth conductive materials CM3 to CM12 may extend along the first direction to form the first to tenth word lines WL1 to WL10.

The thirteenth conductive material CM13 may form the second dummy memory cells DMC2 together with adjacent layers, that is, the first and second insulating layers 116 and 117 and the channel layers 115. The thirteenth conductive material CM13 may extend along the first direction to form the second dummy word line DWL2.

The fourteenth and fifteenth conductive materials CM14 and CM15 may form the lower and upper string selection transistors SST1 and SSTu together with adjacent layers, that is, the first and second insulating layers 116 and 117 and the channel layers 115. The fourteenth and fifteenth conductive materials CM14 and CM15 may extend along the first direction to form lower and upper string selection lines.

As illustrated in FIG. 3, each of the pillars PL may include a first portion adjacent to the substrate 101 and a second portion disposed on the first portion. For example, the first portion is disposed on the substrate and the second portion is stacked on the first portion. Because of a process of manufacturing a nonvolatile memory device, for example, a flash memory device, in the first portion corresponding to the first to seventh conductive materials CM1 to CM7, the width or cross-sectional area of the pillars PL may become smaller as a distance from the substrate 101 decreases and may become larger as a distance from the substrate 101 increases. A boundary layer SP may be present between the first portion and the second portion. In an exemplary embodiment, the boundary layer SP includes a same material as a channel layer 115.

Likewise, in the second portion corresponding to the eighth to fifteenth conductive materials CM8 to CM15, the width or cross-sectional area of the pillars PL may become smaller as a distance from the substrate 101 decreases and may become larger as a distance from the substrate 101 increases. For example, outer walls of the pillars PL may include slanted portions.

Figure 4:
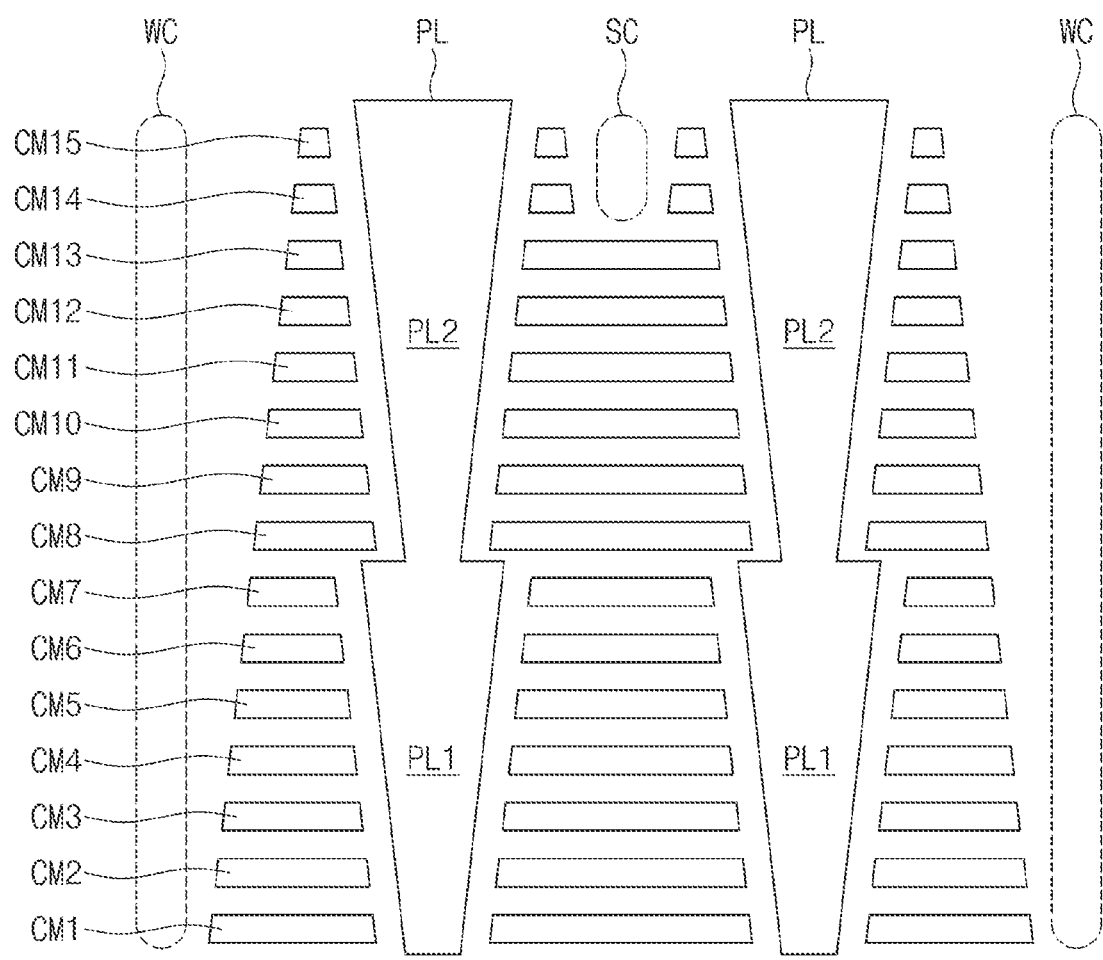
FIG. 4 is a cross-sectional view schematically illustrating a memory block of FIG. 3.

FIG. 4 is a cross-sectional view schematically illustrating the memory block BLK1 of FIG. 3. Referring to FIGS. 1 to 4, the pillars PL include first portions PL1 adjacent to the substrate 101 and second portions PL2 disposed on the first portions PL1.

The fourteenth conductive materials CM14 and the fifteenth conductive materials CM15 may be separated by a selection line cut SC between the second portions PL2 of the pillars PL. The first to fifteenth conductive materials CM1 to CM15 may be separated from different conductive materials by word line cuts WC at opposite sides of the pillars PL.

The seventh conductive materials CM7 and the eighth conductive materials CM8 are adjacent to a boundary between the first portions PL1 and the second portions PL2. The seventh conductive materials CM7 and the eighth conductive materials CM8 located at the boundary between the first portions PL1 and the second portions PL2 may cause a decrease in reliability. For example, a conductive material may be considered adjacent to the boundary when its distance from the boundary is less than or equal a certain threshold distance and considered non-adjacent to the boundary when the distance is greater than the threshold distance. For example, a first conductive material may be considered adjacent to the boundary when there is no intervening second conductive material in a given portion (e.g., PL1, PL2, etc.) between the boundary and the first conductive material.

For example, as the cross-sectional area of the pillar PL increases, a program speed (or efficiency) decreases. Accordingly, as the cross-sectional area of the pillar PL increases, a level of a program voltage for programming the same data may increase.

Accordingly, a level of a program voltage for programming memory cells (e.g., MC5) corresponding to the seventh conductive materials CM7 may be higher than a level of a program voltage for programming different memory cells. That is, a program operation associated with the seventh conductive materials CM7 adjacent to the boundary may act as a strong aggressor causing disturbance at data written at different memory cells adjacent thereto.

In an exemplary embodiment, a distance between the eighth conductive materials CM8 and the first portions PL1 of the pillars PL is smaller than distances between the remaining conductive materials (i.e., conductive materials above the eighth conductive materials CM8) and the pillars PL. That is, when a program voltage is applied to the eighth conductive materials CM8, the program voltage may have a strong influence on the first portions PL1 of the pillars PL.

For example, lateral spreading may occur at the first portions PL1 of the pillars PL. The lateral spreading indicates a phenomenon in which charges trapped in the first insulating layers 116 of the pillars PL are spread in the third direction or in a direction opposite to the third direction. In the case where the lateral spreading occurs, threshold voltages of memory cells (e.g., MC5) corresponding to the seventh conductive materials CM7 may change, thereby reducing the reliability of data.

As described above, a program operation of memory cells (e.g., adjacent memory cells) adjacent to the boundary of the first portions PL1 and the second portions PL2 of the pillars PL may reduce the reliability of data written in surrounding memory cells.

The reliability of the nonvolatile memory device 100 according to an exemplary embodiment of the inventive concept may be improved by adjusting orders of program operations of adjacent memory cells and memory cells (e.g., non-adjacent memory cells) not adjacent to the boundary. Also, by considering the reliability of the adjacent memory cells having low reliability, the nonvolatile memory device 100 may use the adjacent memory cells for data storage and may prevent a decrease of a capacity.

Figure 5:
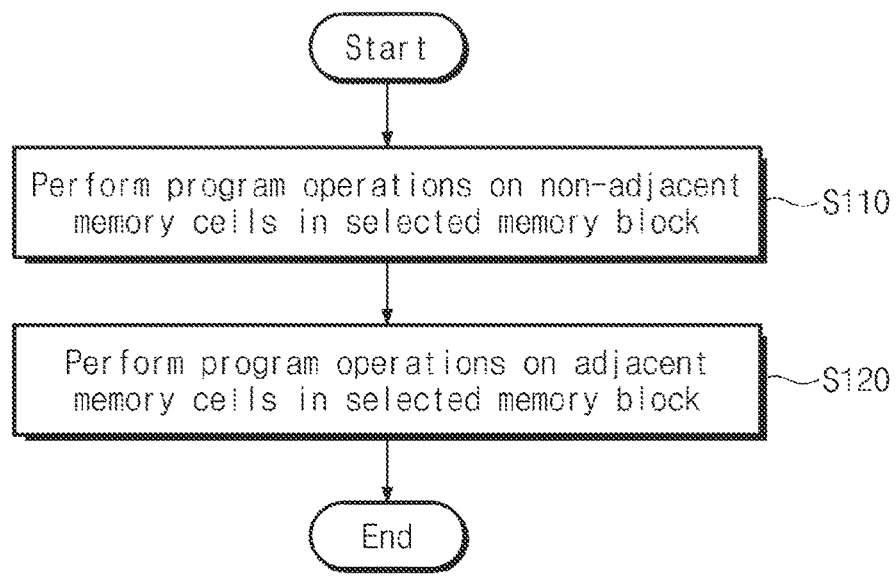
FIG. 5 illustrates an operating method of a nonvolatile memory device according to an exemplary embodiment of the inventive concept.

FIG. 5 illustrates an operating method of the nonvolatile memory device 100 according to an exemplary embodiment of the inventive concept. In an embodiment, in FIG. 5, there is illustrated an example in which, when program operations are consistently (or consecutively) requested with respect to a particular memory block (e.g., a selected memory block) of the nonvolatile memory device 100. For example, the nonvolatile memory device 100 performs program operations under the condition that adjacent memory cells adjacent to the boundary between the first portions PL1 and the second portions PL2 of the pillars PL and non-adjacent memory cells are distinguished. For example, the nonvolatile memory device 100 may re-order the program operations so that some or all of the program operations of the non-adjacent memory cells are performed or complete before the program operations of the adjacent memory cells are performed.

Referring to FIGS. 1, 4, and 5, in operation S110, when program operations are consecutively requested with respect to a selected memory block, the nonvolatile memory device 100 preferentially performs program (e.g., write) operations on non-adjacent memory cells in the selected memory block.

After the program operations of the non-adjacent memory cells in the selected memory block have completed, in operation S120, the nonvolatile memory device 100 performs program operations on adjacent memory cells. That is, the nonvolatile memory device 100 preferentially programs non-adjacent memory cells and then programs adjacent memory cells.

In an exemplary embodiment, when first to third memory cells of a given memory block are initially scheduled to be sequentially programmed, the second memory cell is an adjacent memory cell (e.g., nearest a boundary between portions of a pillar), and the first and third memory cells are non-adjacent memory cells, the control logic 160 controls the nonvolatile memory device 100 to program the first memory cell during a first time, program the third memory cell during a second time after the first time and program the second memory cell during a third time after the second time. In another embodiment, the control logic 160 is configured to schedule program operations of the first memory cell, the third memory cell and then the second memory cell sequentially based on adjacency of the first through third memory cells to the boundary layer SP.

Adjacent memory cells may be designated differently depending on whether any of an influence of a strong aggressor and an influence of the lateral spreading is more dominant at the boundary of the pillars PL of the nonvolatile memory device 100.

In an embodiment, that a program (or a program operation) of particular memory cells has completed may mean that a nonvolatile memory device completes the writing of all data to be stored in the particular memory cells. That is, the nonvolatile memory device 100 may inhibit additional program operations of program-completed memory cells until the program-completed memory cells are erased.

Figure 6:
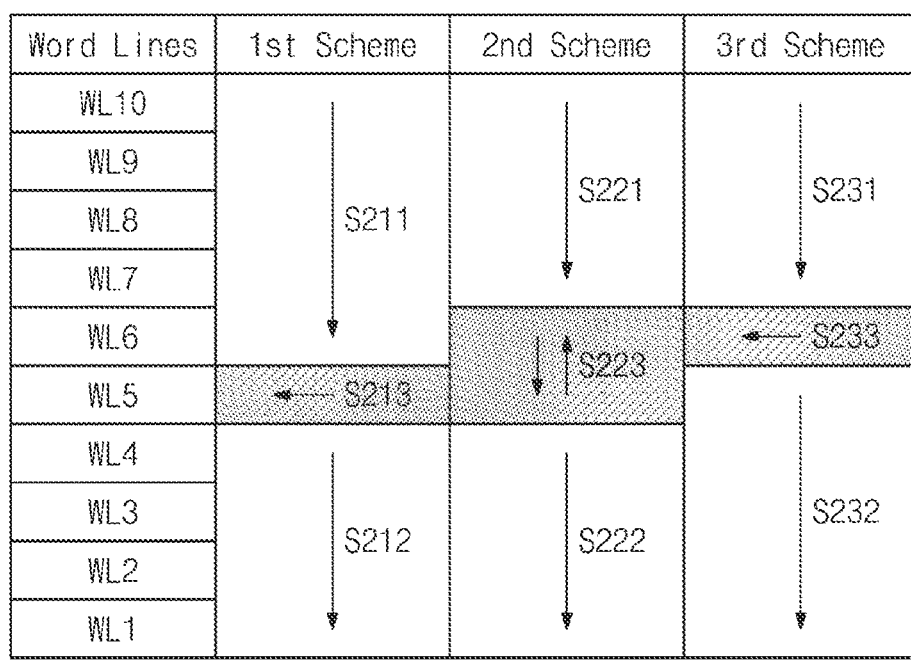
FIG. 6 illustrates examples of schemes in which a nonvolatile memory device performs program operations.

FIG. 6 illustrates examples of schemes in which the nonvolatile memory device 100 performs program operations. Referring to FIGS. 1, 4, and 6, locations of adjacent memory cells are depicted with a dot-filled box or shading. In a 1st scheme, the memory cells MC5 of the fifth word line WL5, which belongs to the first portions PL1 of the pillars PL and is the closest to the boundary, are designated as adjacent memory cells.

In operation S211, the nonvolatile memory device 100 first performs program operations on the non-adjacent memory cells MC6 to MC10 of the sixth to tenth word lines WL6 to WL10 of the second portions PL2 of the pillars PL. Afterwards, in operation S212, the nonvolatile memory device 100 performs program operations on the non-adjacent memory cells MC1 to MC4 of the first to fourth word lines WL1 to WL4 of the first portions PL1 of the pillars PL.

Afterwards, in operation S213, the nonvolatile memory device 100 performs program operations on the adjacent memory cells MC5 of the fifth word line WL5 of the first portions PL1 of the pillars PL. In an embodiment, the 1st scheme is selected in the case where the influence of the lateral spreading is determined to be dominant at the boundary.

In a 2nd scheme, the memory cells MC5 of the fifth word line WL5, which belongs to the first portions PL1 of the pillars PL and is the closest to the boundary, and the memory cells MC6 of the sixth word line WL6, which belongs to the second portions PL2 of the pillars PL and is the closest to the boundary, are designated as adjacent memory cells. In operation S221 and operation S222, the nonvolatile memory device 100 completes program operations of the non-adjacent memory cells.

Afterwards, in operation S223, the nonvolatile memory device 100 completes program operations of the adjacent memory cells. For example, the nonvolatile memory device 100 may perform program operations in the order of the memory cells MC5 of the fifth word line WL5 and the memory cells MC6 of the sixth word line WL6 or in the order of the memory cells MC6 of the sixth word line WL6 and the memory cells MC5 of the fifth word line WL5. In an exemplary embodiment, the 2nd scheme is selected in the case where the influence of the strong aggressor and the influence of the lateral spreading are similar.

In a 3rd scheme, the memory cells MC6 of the sixth word line WL6, which belongs to the second portions PL2 of the pillars PL and is the closest to the boundary, is designated as adjacent memory cells. In operation S231 and operation S232, the nonvolatile memory device 100 completes program operations of non-adjacent memory cells.

Afterwards, in operation S233, the nonvolatile memory device 100 completes program operations of the adjacent memory cells MC6 of the sixth word line WL6. In an exemplary embodiment, the 3rd scheme is selected in the case where the influence of the strong aggressor is dominant.

In an exemplary embodiment of the inventive concept, the nonvolatile memory device 100 designates addresses of memory cells depending on orders of program operations. That is, in the nonvolatile memory device 100, addresses of non-adjacent memory cells may be followed by addresses of adjacent memory cells. For example, during a given program period in which a given memory block is programmed, the row decoder block 120 may receive the addresses (e.g., row addresses) of the non-adjacent memory cells, and then receive the addresses (e.g., row addresses) of the adjacent memory cells from the buffer block 150.

The nonvolatile memory device 100 may designate orders of program operations of non-adjacent memory cells reversely. For example, as illustrated in FIG. 6, the nonvolatile memory device 100 may perform program operations on non-adjacent memory cells in a direction from the bit lines BL1 to BL4 to the substrate 101; in contrast, the nonvolatile memory device 100 may perform program operations on non-adjacent memory cells in a direction from the substrate 101 to the bit lines BL1 to BL4.

Figure 7:
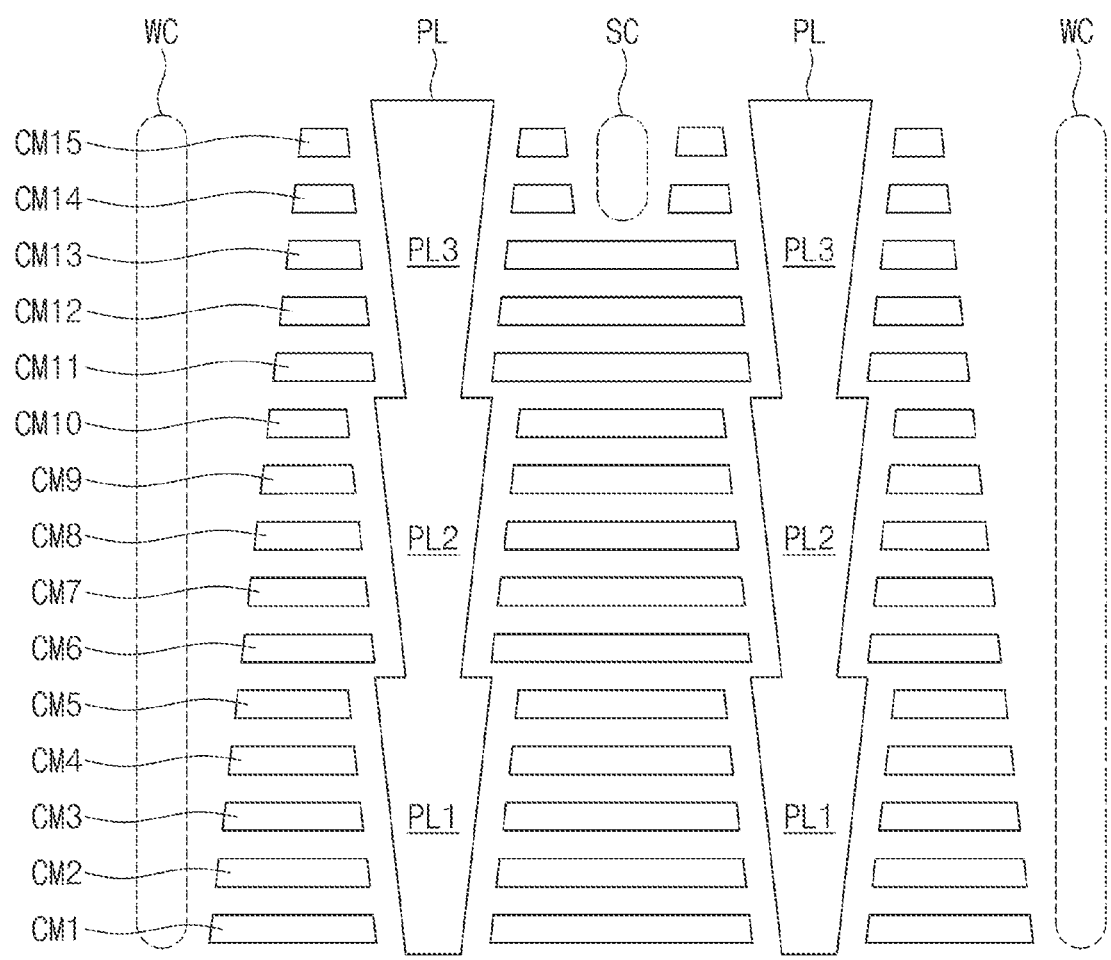
FIG. 7 illustrates an example in which pillars of a memory block are composed of first to third portions.

FIG. 7 illustrates an example in which the pillars PL of a memory block are composed of first to third portions PL1 to PL3. Referring to FIGS. 1, 2, and 7, the pillars PL includes first portions PL1 disposed on the substrate 101, second portions PL2 disposed on the first portions PL1, and third portions PL3 disposed on the second portions PL2.

A first boundary between the first portions PL1 and the second portions PL2 is located between the fifth and sixth conductive materials CM5 and CM6. A second boundary between the second portions PL2 and the third portions PL3 is located between the tenth and eleventh conductive materials CM10 and CM11. The nonvolatile memory device 100 may designate adjacent memory cells at the first boundary and the second boundary.

FIG. 8 illustrates examples in which the nonvolatile memory device 100 performs program operations in a memory block of FIG. 7. Referring to FIGS. 1, 2, 7, and 8, the nonvolatile memory device 100 may select one of 1st to 9th schemes.

In the 4th scheme, the memory cells MC3 of the third word line WL3, which belongs to the first portions PL1 of the pillars PL and is the closest to the first boundary, and the memory cells MC8 of the eighth word line WL8, which belongs to the second portions PL2 of the pillars PL and is the closest to the second boundary, are designated as adjacent memory cells. In operation S311 to operation S313, the nonvolatile memory device 100 completes program operations of the non-adjacent memory cells.

Afterwards, in operation S314, the nonvolatile memory device 100 performs a program operations on the adjacent memory cells MC8 of the eighth word line WL8 of the second portions PL2 of the pillars PL. Afterwards, in operation S315, the nonvolatile memory device 100 performs program operations on the adjacent memory cells MC3 of the third word line WL3 of the first portions PL1 of the pillars PL.

The adjacent memory cells designated in the 5th scheme are the same as the adjacent memory cells designated in the 4th scheme. In operation S321 and operation S322, the nonvolatile memory device 100 completes program operations of non-adjacent memory cells belonging to the third portions PL3 and the second portions PL2 of the pillars PL. Then, in operation S323, the nonvolatile memory device 100 performs program operations on the adjacent memory cells MC8 of the eighth word line WL8 of the second portions PL2 of the pillars PL.

In operation S324, the nonvolatile memory device 100 completes program operations of non-adjacent memory cells belonging to the first portions PL1 of the pillars PL. Afterwards, in operation S325, the nonvolatile memory device 100 performs program operations on the adjacent memory cells MC3 of the third word line WL3 belonging to the first portions PL1 of the pillars PL.

That is, in the case of the 4th scheme, adjacent memory cells are completely programmed after all non-adjacent memory cells are completely programmed. In the case of the 5th scheme, after non-adjacent memory cells surrounding a particular boundary have been completely programmed, corresponding adjacent memory cells are completely programmed.

In the 6th scheme, the memory cells MC3 of the third word line WL3, which belongs to the first portions PL1 of the pillars PL and is the closest to the first boundary, the memory cells MC4 of the fourth word line WL4, which belongs to the second portions PL2 and is the closest to the first boundary, the memory cells MC8 of the eighth word line WL8, which belongs to the second portions PL2 and is the closest to the second boundary, and the memory cells MC9 of the ninth word line WL9, which belongs to the third portions PL3 and is the closest to the second boundary, are designated as adjacent memory cells. In operation S331 to operation S333, the nonvolatile memory device 100 completes program operations of non-adjacent memory cells.

Afterwards, in operation S334, the nonvolatile memory device 100 completes program operations of the adjacent memory cells MC8 and MC9 of the eighth and ninth word lines WL8 and WL9 adjacent to the second boundary. Program operations may be performed in the order of the memory cells MC8 of the eighth word line WL8 and the memory cells MC9 of the ninth word lines WL9 or in the order of the memory cells MC9 of the ninth word lines WL9 and the memory cells MC8 of the eighth word line WL8.

Afterwards, in operation S335, the nonvolatile memory device 100 completes program operations of the adjacent memory cells MC3 and MC4 of the third and fourth word lines WL3 and WL4 adjacent to the first boundary. Program operations may be performed in the order of the memory cells MC3 of the third word line WL3 and the memory cells MC4 of the fourth word lines WL4 or in the order of the memory cells MC4 of the fourth word lines WL4 and the memory cells MC3 of the third word line WL3.

The adjacent memory cells designated in the 7th scheme are the same as the adjacent memory cells designated in the 6th scheme. In operation S341 and operation S342, the nonvolatile memory device 100 completes program operations of non-adjacent memory cells belonging to the third portions PL3 and the second portions PL2 of the pillars PL.

Afterwards, in operation S343, the nonvolatile memory device 100 completes program operations of the adjacent memory cells MC8 and MC9 of the eighth and ninth word lines WL8 and WL9 adjacent to the second boundary. Program operations may be performed in the order of the memory cells MC8 of the eighth word line WL8 and the memory cells MC9 of the ninth word lines WL9 or in the order of the memory cells MC9 of the ninth word lines WL9 and the memory cells MC8 of the eighth word line WL8.

Afterwards, in operation S344, the nonvolatile memory device 100 completes program operations of non-adjacent memory cells belonging to the first portions PL1 of the pillars PL. Afterwards, in operation S345, the nonvolatile memory device 100 completes program operations of the adjacent memory cells MC3 and MC4 of the third and fourth word lines WL3 and WL4 adjacent to the first boundary. Program operations may be performed in the order of the memory cells MC3 of the third word line WL3 and the memory cells MC4 of the fourth word lines WL4 or in the order of the memory cells MC4 of the fourth word lines WL4 and the memory cells MC3 of the third word line WL3.

Operation S351 to operation S355 of the 8th scheme are identical to those of the 4th scheme except that the memory cells MC9 of the ninth word line WL9 are selected as adjacent memory cells instead of the memory cells MC8 of the eighth word line WL8 with regard to the second boundary and the memory cells MC4 of the fourth word line WL4 are selected as adjacent memory cells instead of the memory cells MC3 of the third word line WL3 with regard to the first boundary.

Operation S361 to operation S365 of the 9th scheme are identical to those of the 5th scheme except that the memory cells MC9 of the ninth word line WL9 are selected as adjacent memory cells instead of the memory cells MC8 of the eighth word line WL8 with regard to the second boundary, and the memory cells MC4 of the fourth word line WL4 are selected as adjacent memory cells instead of the memory cells MC3 of the third word line WL3 with regard to the first boundary.

As described with reference to FIG. 6, the nonvolatile memory device 100 may designate addresses of memory cells depending on an order of program operations. Also, the nonvolatile memory device 100 may change the orders of the program operations of the non-adjacent memory cells reversely.

Boundary characteristics of the pillars PL may vary depending on a manufacturing process. Accordingly, orders of program operations that are applied to boundaries in the same pillar may be varied. For example, an order of programming memory cells of two word lines in operation S334 (or operation S343) may be different from an operation of programming memory cells of two word lines in operation S335 (or operation S345).

For example, with regard to the first boundary, adjacent memory cells of a word line relatively close to a substrate are completely programmed, and then, adjacent memory cells of a word line relatively distant from the substrate are completely programmed. In contrast, with regard to the second boundary, adjacent memory cells of a word line relatively distant from the substrate are completely programmed, and then, adjacent memory cells of a word line relatively close to the substrate are completely programmed.

Locations of adjacent memory cells to be designated with regard to each boundary and a program scheme to be applied with regard to each boundary, for example, orders of program operations may be set through an option (e.g., a fuse option) after the nonvolatile memory device 100 is manufactured. For example, the memory device may include one or more fuses or anti-fuses set during manufacturing to indicate which of the schemes to use. For example, the control logic block 160 may analyze the settings (e.g., open or closed) of the fuses or anti-fuses to determine which of the schemes to implement.

Figure 9:
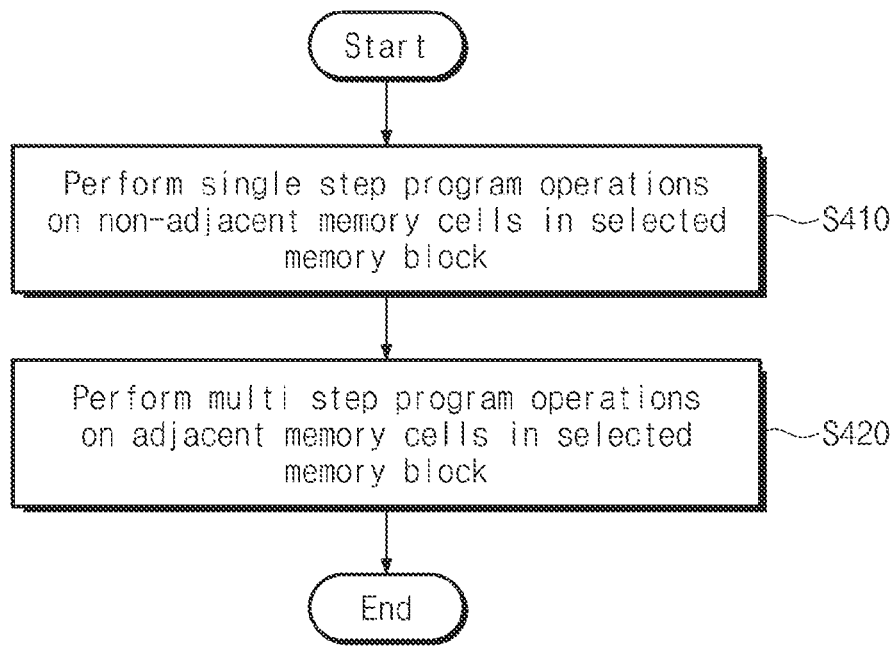
FIG. 9 illustrates an operating method of a nonvolatile memory device according to an exemplary embodiment of the inventive concept.

FIG. 9 illustrates an operating method of a nonvolatile memory device according to an exemplary embodiment of the inventive concept. Referring to FIGS. 1, 2, and 9, in operation S410, the nonvolatile memory device 100 performs single step program operations on non-adjacent memory cells of a selected memory block. In the single step program operation, selected memory cells targeted for a program operation are completely programmed through one program operation.

In operation S420, the nonvolatile memory device 100 perform multi step program operations on adjacent memory cells of the selected memory block. In the multi-step program operation, selected memory cells targeted for a program operation are completely programmed through two or more program operations. Between two or more program operations, a program operation (e.g., a single or multi step program operation) may be performed on memory cells of an adjacent word line.

Figure 10:
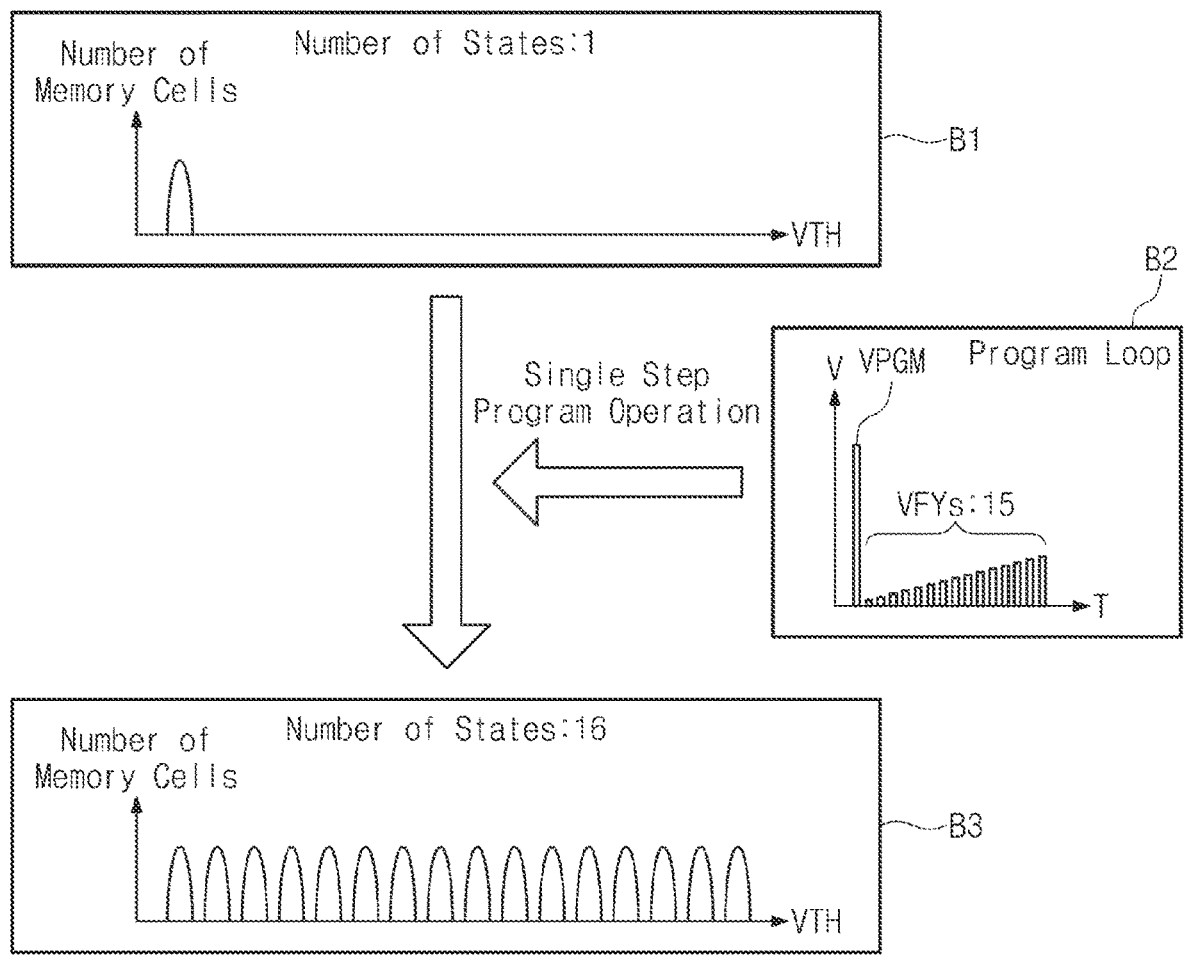
FIG. 10 illustrates an example of a single step program operation.

FIG. 10 illustrates an example of a single step program operation. In a first block B1 and a third block B3 of FIG. 10, a horizontal axis represents threshold voltages VTH of memory cells, and a vertical axis represents the number of memory cells. In a second block B2 of FIG. 10, a horizontal axis represents a time "T", and a vertical axis represents a voltage "V" to be applied to memory cells through a word line.

As illustrated in the first block B1, memory cells of an erase state have threshold voltages belonging to one threshold voltage range (e.g., state). A program operation for memory cells may include two or more program loops. The second block B2 illustrates an exemplary program loop.

In each program loop, a program voltage VPGM may be applied to memory cells through a word line. The program voltage VPGM may increase threshold voltages of the memory cells. Afterwards, verify voltages VFYs may be applied to the memory cells. The verify voltages VFYs may be used to verify whether the threshold voltages of the memory cells reach a target state.

For example, when four bits are written in each memory cell, program-completed memory cells may have one of 16 states. In this case, 15 verify voltages VFYs may be used. The 15 verify voltages VFYs may be used to verify whether the threshold voltages of the memory cells reach a target state of one of 15 states (e.g., program states) higher than the erase state.

Figure 11:
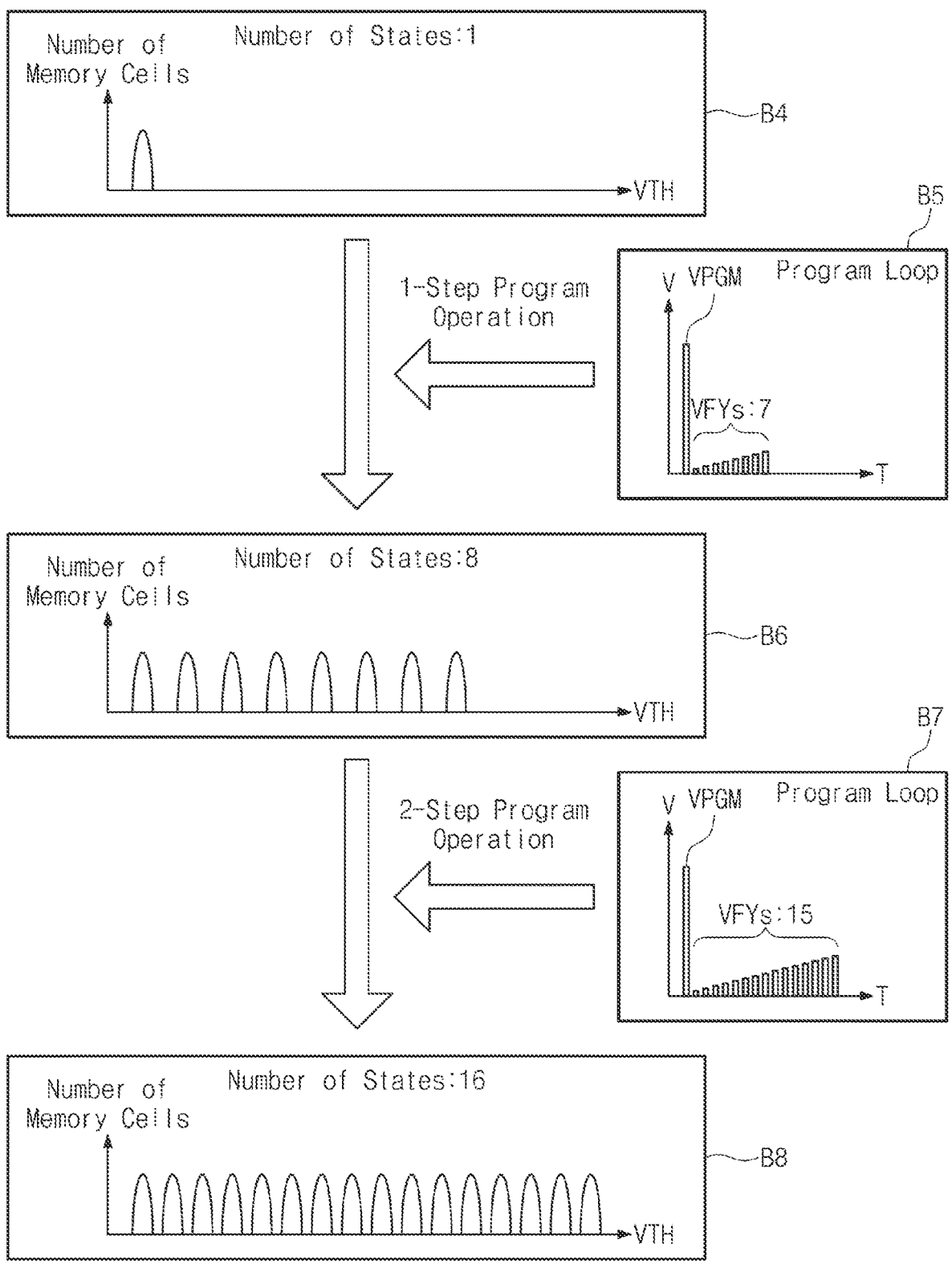
FIG. 11 illustrates an example of a multi-step program operation.

FIG. 11 illustrates an example of a multi-step program operation. In a fourth block B4, a sixth block B6, and an eighth block B8 of FIG. 11, a horizontal axis represents threshold voltages VTH of memory cells, and a vertical axis represents the number of memory cells. In a fifth block B5 and a seventh block B7 of FIG. 11, a horizontal axis represents a time "T", and a vertical axis represents a voltage "V" to be applied to memory cells through a word line.

In an exemplary embodiment, the multi-step program operation includes a 1-step program operation and a 2-step program operation. Each of the 1-step program operation and the 2-step program operation may include two or more program loops. The fifth block B5 illustrates an example of a program loop of the 1-step program operation.

A program loop may include a program voltage VPGM and verify voltages VFYs. For example, the number of verify voltages VFYs may be 7. In the case where the 1-step program operation has completed, as illustrated in the fourth block B4 and the sixth block B6, memory cells may be programmed from an erase state to one of the erase state and 7 program states.

The seventh block B7 illustrates an example of a program loop of the 2-step program operation. A program loop may include a program voltage VPGM and verify voltages VFYs. For example, the number of verify voltages VFYs may be 15. In the case where the 2-step program operation has completed, the memory cells in the 8 states of the sixth block B6 may be programmed to one of 16 states of the eighth block B8.

As illustrated in FIG. 11, bits may be written in respective memory cells through the 1-step program operation, and additional bits may be further written in the memory cells through the 2-step program operation. That is, the number of bits stored in each memory cell when the 1-step program operation has completed may be different from the number of bits stored in each memory cell when the 2-step program operation has completed.

For example, bits may be coarsely written in memory cells through the 1-step program operation. The bits coarsely written in the memory cells may be finely written through the 2-step program operation. That is, the number of bits stored in each memory cell when the 1-step program operation has completed may be identical to the number of bits stored in each memory cell when the 2-step program operation has completed.

In an embodiment, threshold voltages of the dummy memory cells DMC1 and DMC2 illustrated in FIG. 2 are different from threshold voltages of the third block B3 and the eighth block B8. The dummy memory cells DMC1 and DMC2 may have threshold voltages belonging to one distribution range widely formed between the lowest state and the highest state of the third block B3 and the eighth block B8.

Figure 12:
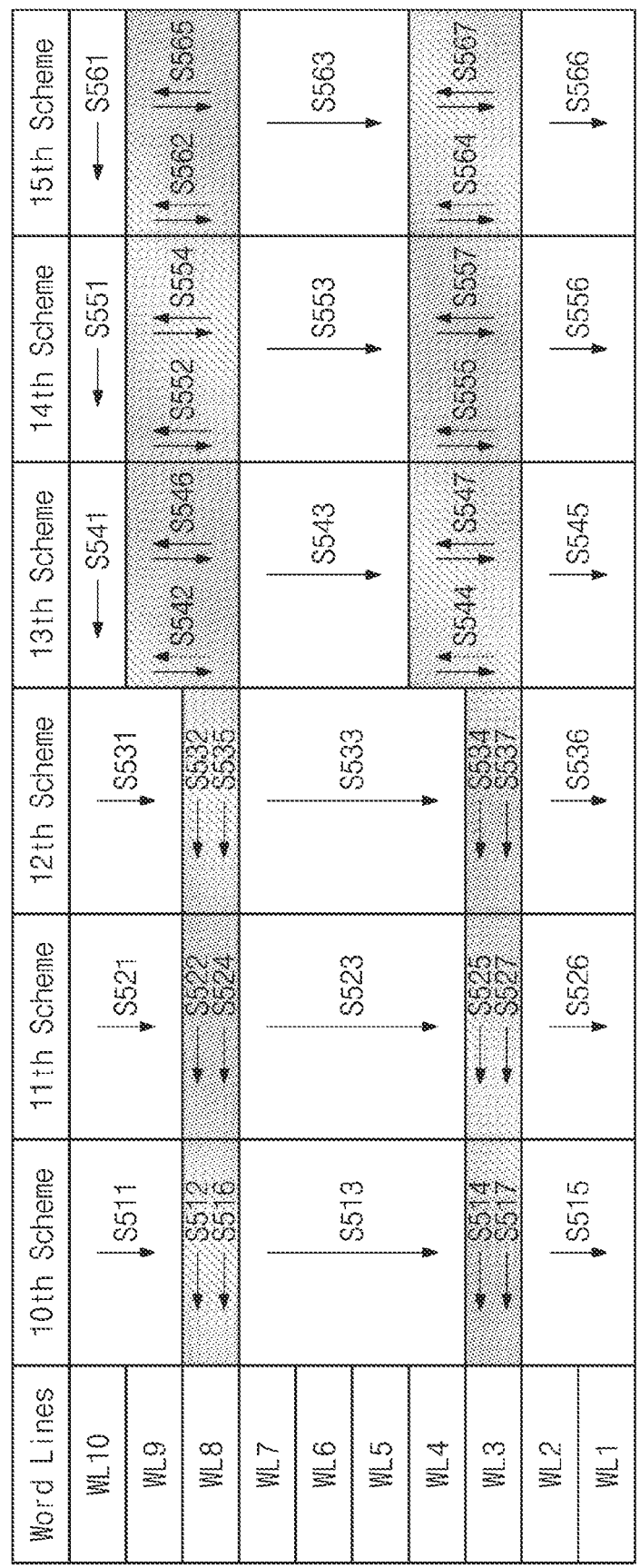

FIGS. 12 and 13 illustrate examples in which the nonvolatile memory device 100 performs program operations depending on the operating method of FIG. 9. Referring to FIGS. 1, 2, 7, and 12, the nonvolatile memory device 100 selects one of 10th to 15th schemes.

In the 10th scheme, the memory cells MC8 of the eighth word line WL8, which belongs to the second portions PL2 of the pillars PL and is the closest to the second boundary, and the memory cells MC3 of the third word line WL3, which belongs to the first portions PL1 of the pillars PL and is the closest to the first boundary, are designated as adjacent memory cells.

Through operation S511 to operation S515, the nonvolatile memory device 100 may sequentially program memory cells in a direction from the bit lines BL1 to BL4 to the substrate 101. In this case, the nonvolatile memory device 100 completes program operations of non-adjacent memory cells and partially performs program operations of adjacent memory cells. For example, the nonvolatile memory device 100 completes only 1-step program operations of the adjacent memory cells (operation S512 and operation S514).

Afterwards, the nonvolatile memory device 100 completes the program operations of the adjacent memory cells by completing 2-step program operations of the adjacent memory cells (operation S516 and operation S517).

The adjacent memory cells designated in the 11th scheme are the same as the adjacent memory cells designated in the $10^{th}$ scheme. Through operation S521 to operation S523, the nonvolatile memory device 100 completes program operations of non-adjacent memory cells in a direction from the bit lines BL1 to BL4 to the substrate 101 and then completes a 1-step program operation of the adjacent memory cells.

Afterwards, in operation S524, the nonvolatile memory device 100 completes a 2-step program operation of adjacent memory cells between the program-completed non-adjacent memory cells. Afterwards, in operation S525 and operation S526, the nonvolatile memory device 100 completes a 1-step program operation of non-adjacent memory cells in the same direction and completes a 1-step program operations of adjacent memory cells.

Afterwards, in operation S527, the nonvolatile memory device 100 completes a 2-step program operation of adjacent memory cells between the program-completed non-adjacent memory cells.

In an embodiment, the nonvolatile memory device 100 divides operation S523 into portions or sub-operations. For example, the nonvolatile memory device 100 may perform operation S524 after completing a program operation of non-adjacent memory cells MC7 closest to the second boundary (e.g., a portion of operation S523). Afterwards, the nonvolatile memory device 100 may perform the remaining portions of operation S523.

The adjacent memory cells designated in the 12th scheme are the same as the adjacent memory cells designated in the $10^{th}$ scheme. Through operation S531 to operation S534, the nonvolatile memory device 100 completes program operations of non-adjacent memory cells in a direction from the bit lines BL1 to BL4 to the substrate 101 and completes a 1-step program operation of the adjacent memory cells.

Afterwards, in operation S535, the nonvolatile memory device 100 completes a 2-step program operation of adjacent memory cells between the program-completed non-adjacent memory cells. Afterwards, in operation S536, the nonvolatile memory device 100 completes program operations of non-adjacent memory cells. Afterwards, in operation S537, the nonvolatile memory device 100 completes a 2-step program operation of adjacent memory cells between the program-completed non-adjacent memory cells.

In the 13th scheme, the memory cells MC9 of the ninth word line WL9, which belongs to the third portions PL3 of the pillars PL and is the closest to the second boundary, the memory cells MC8 of the eighth word line WL8, which belongs to the second portions PL2 and is the closest to the second boundary, the memory cells MC4 of the fourth word line WL4, which belongs to the second portions PL2 and is the closest to the first boundary, and the memory cells MC3 of the third word line WL3, which belongs to the first portions PL1 and is the closest to the first boundary, are designated as adjacent memory cells.

Through operation S541 to operation S545, the nonvolatile memory device 100 sequentially programs memory cells in a direction from the bit lines BL1 to BL4 to the substrate 101. In this case, the nonvolatile memory device 100 completes program operations of non-adjacent memory cells and partially performs program operations of adjacent memory cells.

For example, the nonvolatile memory device 100 completes only 1-step program operations of the adjacent memory cells (operation S542 and operation S544). Afterwards, the nonvolatile memory device 100 completes the program operations of the adjacent memory cells by completing 2-step program operations of the adjacent memory cells (operation S546 and operation S547).

For example, in two word lines connected to adjacent memory cells, an order of 1-step program operations or 2-step program operations may be a direction from the bit lines BL1 to BL4 to the substrate 101 or in a direction from the substrate 101 to the bit lines BL1 to BL4.

The adjacent memory cells designated in the 14th scheme are the same adjacent memory cells designated in the $13^{th}$ scheme. Through operation S551 to operation S553, the nonvolatile memory device 100 completes program operations of non-adjacent memory cells in a direction from the bit lines BL1 to BL4 to the substrate 101 and completes 1-step program operations of the adjacent memory cells.

Afterwards, in operation S554, the nonvolatile memory device 100 completes 2-step program operations of adjacent memory cells between the program-completed non-adjacent memory cells. Afterwards, in operation S555 and operation S556, the nonvolatile memory device 100 completes program operations of non-adjacent memory cells in the same direction and completes 1-step program operations of adjacent memory cells.

Afterwards, in operation S557, the nonvolatile memory device 100 completes 2-step program operations of adjacent memory cells between the program-completed non-adjacent memory cells.

In an embodiment, the nonvolatile memory device 100 divides operation S553 into portions or sub-operations. For example, the nonvolatile memory device 100 may perform operation S554 after completing a program operation of non-adjacent memory cells MC7 closest to the second boundary (e.g., a portion of operation S553). Afterwards, the nonvolatile memory device 100 may perform the remaining portions of operation S553.

In the 15th scheme, the adjacent memory cells may be designated to be identical to the adjacent memory cells designed in the 13th scheme. Through operation S561 to operation S564, the nonvolatile memory device 100 completes program operations of non-adjacent memory cells in a direction from the bit lines BL1 to BL4 to the substrate 101 and completes 1-step program operations of the adjacent memory cells.

Afterwards, in operation S565, the nonvolatile memory device 100 completes 2-step program operations of adjacent memory cells between the program-completed non-adjacent memory cells. Afterwards, in operation S566, the nonvolatile memory device 100 completes program operations of non-adjacent memory cells. Afterwards, in operation S567, the nonvolatile memory device 100 completes 2-step program operations of adjacent memory cells between the program-completed non-adjacent memory cells.

Referring to FIGS. 1, 2, 7, 12, and 13, the 16th scheme is identical to the 10th scheme except that the memory cells MC9 of the ninth word line WL9 are selected as adjacent memory cells instead of the memory cells MC8 of the eighth word line WL8 with regard to the second boundary and the memory cells MC4 of the fourth word line WL4 are selected as adjacent memory cells instead of the memory cells MC3 of the third word line WL3 with regard to the first boundary.

The 17th scheme is identical to the 11th scheme except that the memory cells MC9 of the ninth word line WL9 are selected as adjacent memory cells instead of the memory cells MC8 of the eighth word line WL8 with regard to the second boundary and the memory cells MC4 of the fourth word line WL4 are selected as adjacent memory cells instead of the memory cells MC3 of the third word line WL3 with regard to the first boundary.

The 18th scheme is identical to the 12th scheme except that the memory cells MC9 of the ninth word line WL9 are selected as adjacent memory cells instead of the memory cells MC8 of the eighth word line WL8 with regard to the second boundary and the memory cells MC4 of the fourth word line WL4 are selected as adjacent memory cells instead of the memory cells MC3 of the third word line WL3 with regard to the first boundary.

As described with reference to FIG. 6, the nonvolatile memory device 100 may designate addresses of memory cells depending on an order of program operations. Also, the nonvolatile memory device 100 may change the orders of the program operations of the non-adjacent memory cells reversely. Also, as described with reference to FIG. 8, at different boundaries, adjacent memory cells may be programmed in different orders.

Locations of adjacent memory cells to be designated with regard to each boundary and a program scheme to be applied with regard to each boundary, for example, orders of program operations may be set through an option (e.g., a fuse option) after the nonvolatile memory device 100 is manufactured.

Figure 14:
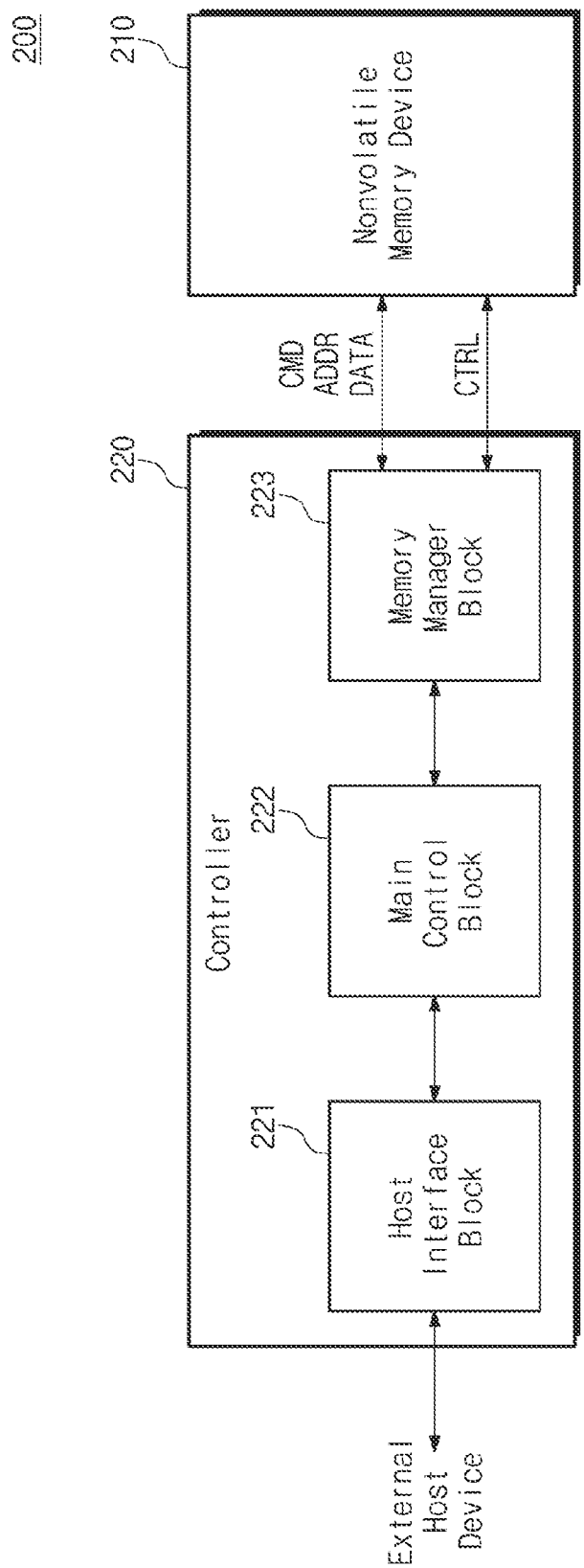
FIG. 14 illustrates a storage device including a nonvolatile memory device.

FIG. 14 illustrates a storage device 200 including a nonvolatile memory device 210 according to an exemplary embodiment of the inventive concept. Referring to FIG. 14, the storage device 200 includes the nonvolatile memory device 210 and a controller 220 (e.g., a memory controller or control circuit). The nonvolatile memory device 210 may be configured and operate as described with reference to FIGS. 1 to 13.

A controller 220 may control a read operation, a write operation, and an erase operation of the nonvolatile memory device 210. The controller 220 may include a host interface block 221 (e.g., a host interface circuit), a main control block 222 (e.g., a control circuit), and a memory manager block 223 (e.g., a memory manager or a control circuit).

The host interface block 221 may transfer a request or a command received from an external host device to the main control block 222. The main control block 222 may generate a command CMD and an address ADDR for accessing the nonvolatile memory device 210 depending on a request of the external host device or an internal schedule and may transfer the command CMD and the address ADDR to the memory manager block 223.

The memory manager block 223 may exchange the command CMD, the address ADDR, and the data "DATA" with the nonvolatile memory device 210 through the first channel CH1 (refer to FIG. 1). The memory manager block 223 may exchange a control signal CTRL with the nonvolatile memory device 210 through a second channel.

Figure 15:
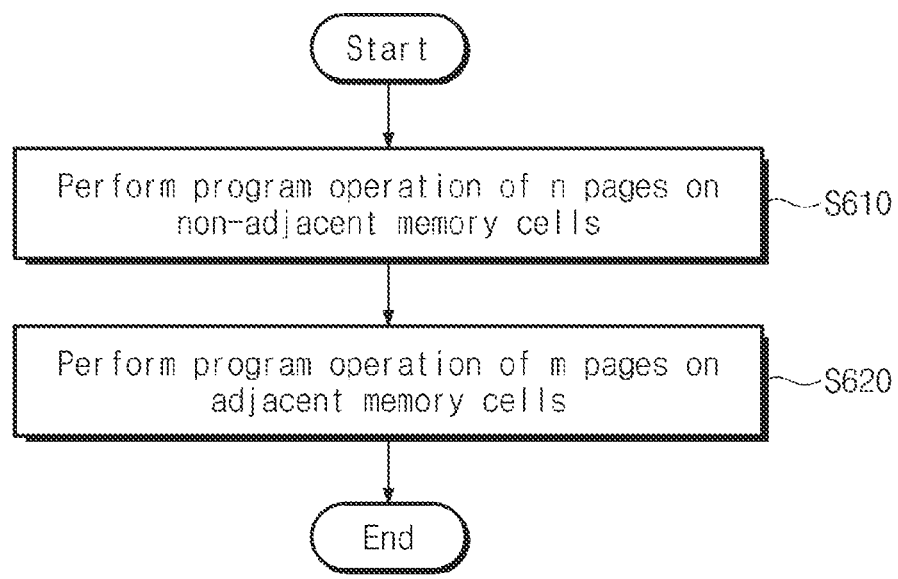
FIG. 15 illustrates an operating method of a storage device according to an exemplary embodiment of the inventive concept.

FIG. 15 illustrates an example of an operating method of the storage device 200 according to an exemplary embodiment of the inventive concept. Referring to FIGS. 14 and 15, in operation S610, the controller 220 performs a program operation of "n" pages (n being a positive integer of 2 or more) on non-adjacent memory cells. The controller 220 may control the nonvolatile memory device 210 such that a program operation is completed by writing "n" bits in each of the non-adjacent memory cells.

In operation S620, the controller 220 performs a program operation of "m" pages (m and n being positive integers) on adjacent memory cells. The controller 220 may control the nonvolatile memory device 210 such that a program operation is completed by writing "m" bits in each of the non-adjacent memory cells. In an exemplary embodiment, "m" is less than "n".

In an exemplary embodiment, even if some or all of the "m" pages are initially scheduled to be programmed before some of the "n" pages, the controller 220 adjusts the program order so that all the "n" pages are first programmed, and then after the programming of the "n" pages have completed, all of the "m" pages are programmed.

The storage device 200 may improve the reliability of data written in an adjacent memory cell by writing data, the amount of which is less than the amount of data written in the non-adjacent memory cells, in the adjacent memory cells. In an embodiment, the adjacent memory cells are designated as illustrated in FIGS. 6, 8, 12, and 13.

In an exemplary embodiment, during a given programming period, a first amount of data is written to the non-adjacent memory cells during a first time of the period and a second amount of data is written to the adjacent memory cells during a second time of the period after the first time, where the second amount is less than the first amount.

Figure 16:
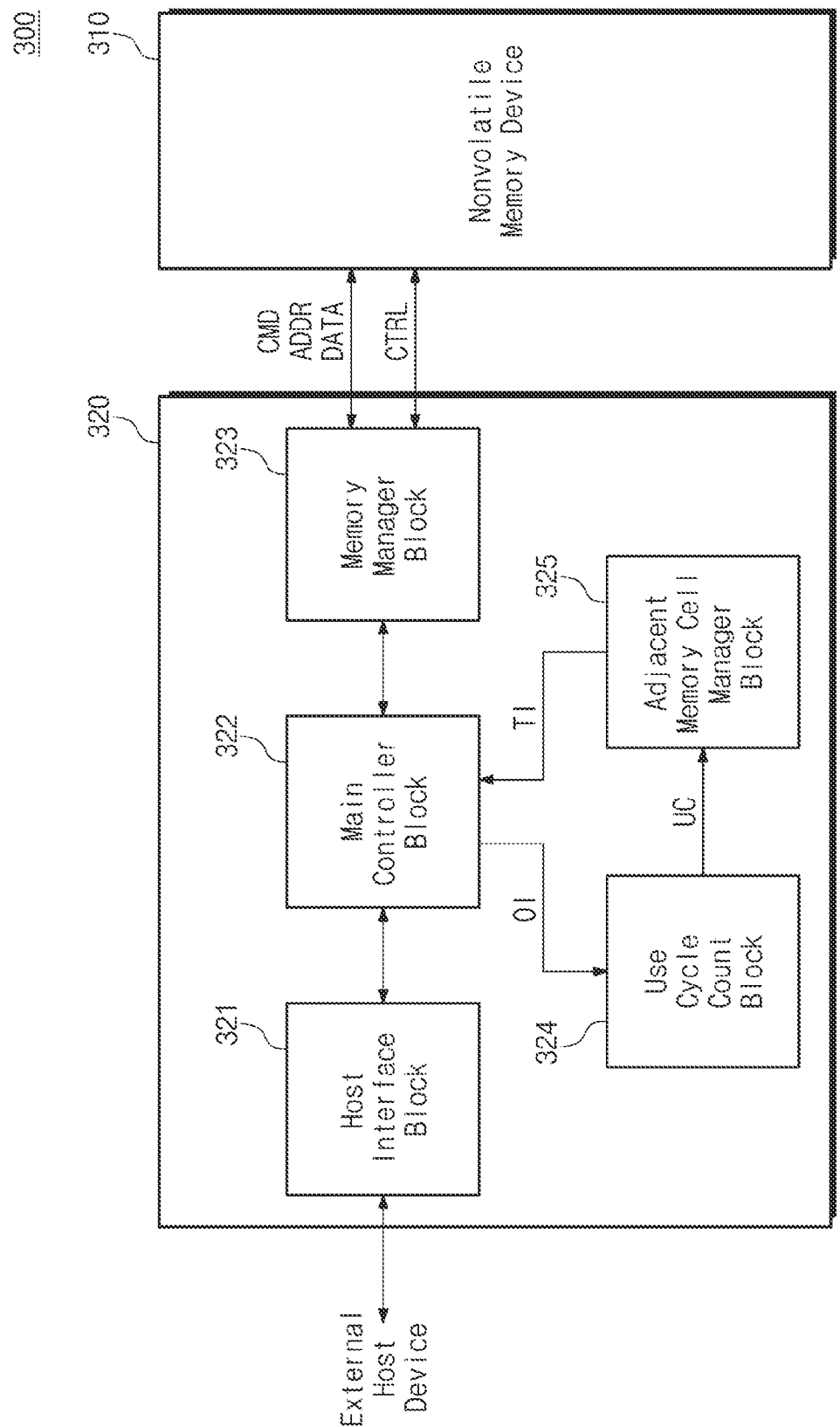
FIG. 16 illustrates a storage device according to an exemplary embodiment of the inventive concept.

FIG. 16 illustrates a storage device 300 according to an exemplary embodiment of the inventive concept. Referring to FIGS. 1 and 16, the storage device 300 includes a nonvolatile memory device 310 and a controller 320. The controller 320 includes a host interface block 321, a main control block 322, a memory manager block 323, a user cycle count block 324 (e.g., a counting circuit), and an adjacent memory cell manager block 325 (e.g., a memory manager or a control circuit).

The nonvolatile memory device 310, the host interface block 321, the main control block 322, and the memory manager block 323 are identical to those described with reference to FIG. 14. Thus, additional description will be omitted to avoid redundancy.

The user cycle count block 324 receives operation information OI from the main control block 322. The operation information OI may include information of operations directed to the nonvolatile memory device 310. The user cycle count block 324 may count use cycles of the respective memory blocks BLK1 to BLKz depending on the operation information M.

For example, a use cycle of each memory block may include a program and erase count. The use cycle of each memory block may be calculated by applying weights to various parameters such as a program and erase count, a read count, and a left-along time after a program operation.

The user cycle count block 324 transfers use cycle information UC of the memory blocks BLK1 to BLKz to the adjacent memory cell manager block 325. The adjacent memory cell manager block 325 determines whether a use cycle of a particular memory block reaches a given threshold value. When it is determined that the use cycle of the particular memory block reaches the given threshold value, the adjacent memory cell manager block 325 transfers a threshold notification TI to the main control block 322.

In an exemplary embodiment, the main control block 322 decreases the number of pages to be written in adjacent memory cells in response to the threshold notification TI. For example, two or more threshold values may be set for each of the memory blocks BLK1 to BLKz. The two or more threshold values may correspond to boundaries of different heights (heights in the third direction) in each memory block. That is, the controller 320 may decrease the number of pages to be written in adjacent memory cells of boundaries of different heights at different timings, based on different threshold values. For example, if a first memory block is written, erased, and/or read from too often, the reliability of its adjacent memory cells may be lower than the adjacent memory cells of a second memory block that is written, erased, or read from less often. For example, the main control block 322 could initially allow all pages of the adjacent memory cells of the given block to be written, and then upon determining that the given memory block has been written, erased, and/or read too often, could only allow half of the pages to be written in the future.

The storage device 300 may use adjacent memory cells for the purpose of storing user data transferred from the external host device, storing internally generated meta data, or improving performance. In the case where adjacent memory cells are used to store user data and the number of pages to be written in the adjacent memory cells decreases, the storage device 300 may notify the host device of a decrease of a capacity.

Figure 17:
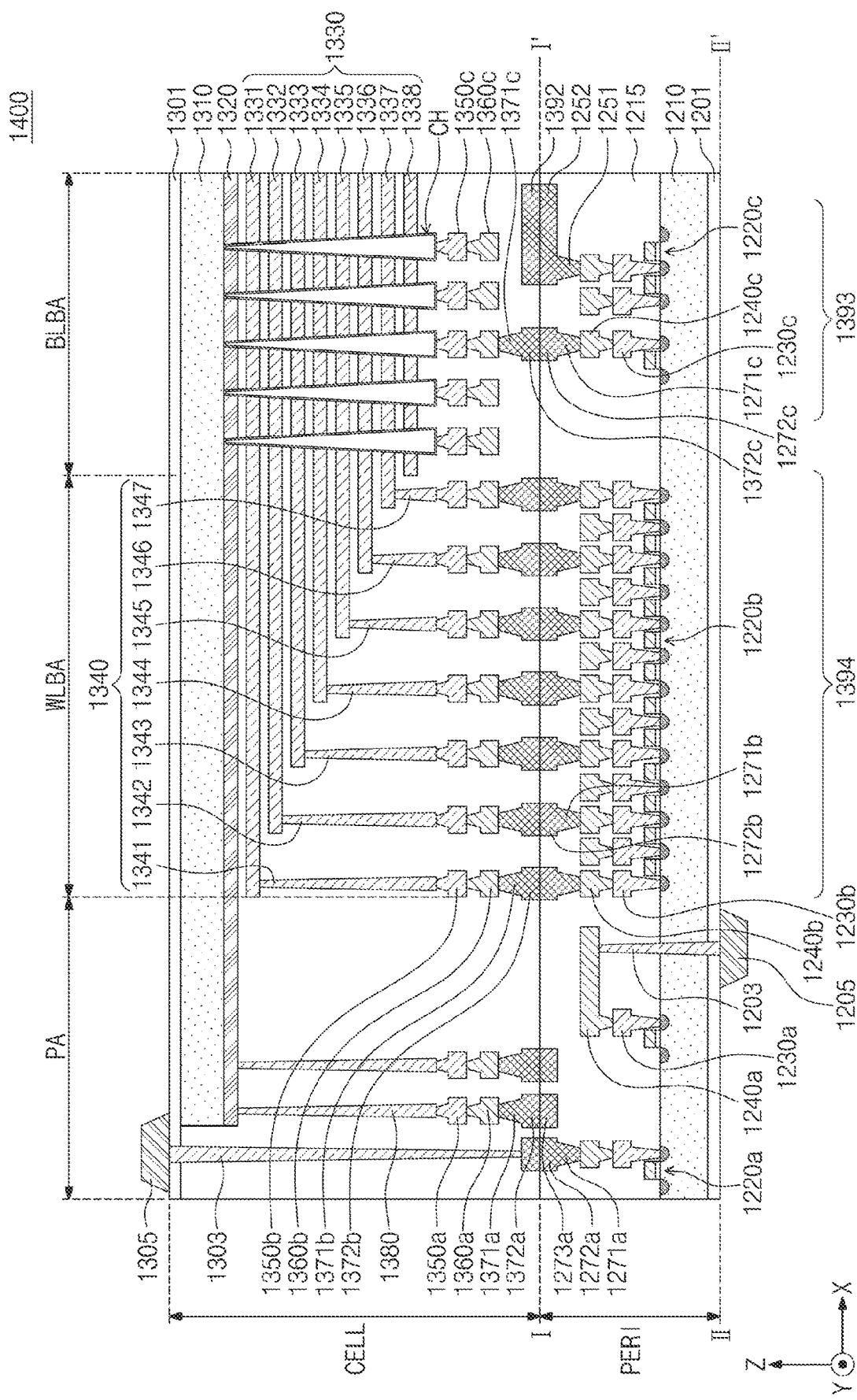
FIG. 17 is a diagram illustrating an exemplary nonvolatile memory device.

FIG. 17 is a diagram illustrating an exemplary nonvolatile memory device 1400. Referring to FIG. 17, the X-direction may correspond to an opposite direction of the second direction. The Y-direction may correspond to the first direction. The Z-direction may correspond to the third direction. The nonvolatile memory device 1400 may correspond to the nonvolatile memory device 100 of FIG. 1. The memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1400 may include an external pad bonding area PA, a word line bonding area WLBA, and a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having relatively high resistance, and the second metal layers 1240a, 1240b, and 1240c may be formed of copper having relatively low resistance.

In an example embodiment illustrated in FIG. 17, although the first metal layers 1230a, 1230b, and 1230c and the second metal layers 1240a, 1240b, and 1240c are shown and described, they are not limited thereto, and one or more metal layers may be further formed on the second metal layers 1240a, 1240b, and 1240c. At least a portion of the one or more metal layers formed on the second metal layers 1240a, 1240b, and 1240c may be formed of aluminum or the like having a lower resistance than those of copper forming the second metal layers 1240a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically connected to upper bonding metals 1371b and 1372b in the cell region CELL in a bonding manner, and the lower bonding metals 1271b and 1272b and the upper bonding metals 1371b and 1372b may be formed of aluminum, copper, tungsten, or the like.

Further, the upper bonding metals 1371b and 1372b in the cell region CELL may be referred to as first metal pads and the lower bonding metals 1271b and 1272b in the peripheral circuit region PERI may be referred to as second metal pads.

The cell region CELL may include at least one memory block. The cell region CELL may include a second substrate 1310 and a common source line 1320. On the second substrate 1310, a plurality of word lines 1331 to 1338 (i.e., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

In the bit line bonding area BLBA, a channel structure CH may extend in a direction, perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In an example embodiment, the bit line 1360c may extend in a first direction (a Y-axis direction), parallel to the upper surface of the second substrate 1310.

In an example embodiment illustrated in FIG. 17, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. For example, the bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393.

In the word line bonding area WLBA, the plurality of word lines 1330 may extend in a second direction (an X-axis direction), parallel to the upper surface of the second substrate 1310, and may be connected to a plurality of cell contact plugs 1341 to 1347 (i.e., 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1360b may be connected to an upper portion of the plurality of cell contact plugs 1340 connected to the plurality of word lines 1330, sequentially. The plurality of cell contact plugs 1340 may be connected to the circuit region PERI by the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1220b providing a row decoder 1394 in the peripheral circuit region PERI. In an example embodiment, operating voltages of the circuit elements 1220b providing the row decoder 1394 may be different than operating voltages of the circuit elements 1220c providing the page buffer 1393. For example, operating voltages of the circuit elements 1220c providing the page buffer 1393 may be greater than operating voltages of the circuit elements 1220b providing the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked on an upper portion of the common source line contact plug 1380, sequentially. For example, an area in which the common source line contact plug 1380, the first metal layer 1350a, and the second metal layer 1360a are disposed may be defined as the external pad bonding area PA.

Input-output pads 1205 and 1305 may be disposed in the external pad bonding area PA. Referring to FIG. 17, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 17, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220a, 1220b, and 1220c disposed in the peripheral circuit region PERI through a second input-output contact plug 1303.

According to embodiments, the second substrate 1310 and the common source line 1320 are not disposed in an area in which the second input-output contact plug 1303 is disposed. Also, in an embodiment, the second input-output pad 1305 does not overlap the word lines 1330 in the third direction (the Z-axis direction). Referring to FIG. 17, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305 and the lower bonding metals 1271a and 1272a of the peripheral circuit area PERI.

According to embodiments, the first input-output pad 1205 and the second input-output pad 1305 may be selectively formed. For example, the memory device 1400 may include only the first input-output pad 1205 disposed on the first substrate 1210 or the second input-output pad 1305 disposed on the second substrate 1310. Alternatively, the memory device 1400 may include both the first input-output pad 1205 and the second input-output pad 1305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273a, corresponding to an upper metal pattern 1372a formed in an uppermost metal layer of the cell region CELL, and having the same shape as the upper metal pattern 1372a of the cell region CELL, in an uppermost metal layer of the peripheral circuit region PERI. In the peripheral circuit region PERI, in an embodiment, the lower metal pattern 1273a formed in the uppermost metal layer of the peripheral circuit region PERI is not connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 1271b and 1272b may be formed on the second metal layer 1240b in the word line bonding area WLBA. In the word line bonding area WLBA, the lower bonding metals 1271b and 1272b of the peripheral circuit region PERI may be electrically connected to the upper bonding metals 1371b and 1372b of the cell region CELL by a Cu—Cu bonding.

Further, the bit line bonding area BLBA, an upper metal pattern 1392, corresponding to a lower metal pattern 1252 formed in the uppermost metal layer of the peripheral circuit region PERI, and having the same shape as the lower metal pattern 1252 of the peripheral circuit region PERI, may be formed in an uppermost metal layer of the cell region CELL. In an embodiment, a contact is not formed on the upper metal pattern 1392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact is not formed on the reinforcement metal pattern.

In the above disclosure, components of the inventive concept are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits implemented as an intellectual property (IP) block or core.

According to at least one embodiment of the inventive concept, a program operation of adjacent memory cells are performed after program operations of non-adjacent memory cells have completed. Accordingly, there are provided a nonvolatile memory device, a storage device, and an operating method of the nonvolatile memory device, which are capable of securing reliability while preventing the reliability of data from decreasing through the program operation of the non-adjacent memory cells and preventing a capacity from decreasing.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. A nonvolatile memory device comprising:
   a memory cell array disposed on a substrate, wherein the memory cell array comprises a plurality of memory blocks;
   a row decoder connected to the memory cell array through word lines; and
   a page buffer connected to the memory cell array through bit lines,
   wherein each of the memory blocks comprises a pillar including a first portion disposed on the substrate and a second portion stacked on the first portion,
   wherein at least a portion of a width of the first portion increases as a distance from the substrate increases, and first conductive materials and first insulating layers surround the first portion and are stacked in turn on the substrate,
   wherein at least a portion of a width of the second portion increases as a distance from the substrate increases, and second conductive materials and second insulating layers surround the second portion and are stacked in turn on the substrate,
   wherein a first boundary is located between the first portion and the second portion,
   wherein the first conductive materials form first memory cells together with the first portion and the second conductive materials form second memory cells together with the second portion, and
   wherein, when performing program operations based on consecutive addresses in a selected memory block of the memory blocks, the row decoder and the page buffer are configured to complete a second program operation of an adjacent memory cell adjacent to the first boundary after sequentially completing first program operations of non-adjacent memory cells not adjacent to the first boundary from among the first and second memory cells,
   wherein, a number of bits to be programmed in the adjacent memory cell is equal to or smaller than a number of bits to be programmed in each of the non-adjacent memory cells.

2. The nonvolatile memory device of claim 1, wherein the adjacent memory cell includes a memory cell closest to the first boundary from among the first memory cells.

3. The nonvolatile memory device of claim 1, wherein the first program operations include third program operations of first non-adjacent memory cells belonging to the first portion from among the non-adjacent memory cells and fourth program operations of second non-adjacent memory cells belonging to the second portion from among the non-adjacent memory cells,
   wherein the second program operation includes a 1-step program operation and a 2-step program operation, and
   wherein the row decoder and the page buffer are further configured to:
      complete one of the third program operations and the fourth program operations;
      perform the 1-step program operation;
      complete the other of the third program operations and the fourth program operations; and
      then perform the 2-step program operation.

4. The nonvolatile memory device of claim 1, wherein the adjacent memory cell includes a memory cell closest to the first boundary from among the second memory cells.

5. The nonvolatile memory device of claim 1, wherein the adjacent memory cell includes a memory cell closest to the first boundary from among the first memory cells and a memory cell closest to the first boundary from among the second memory cells.

6. The nonvolatile memory device of claim 5, wherein the first program operations include third program operations of first non-adjacent memory cells belonging to the first portion from among the non-adjacent memory cells and fourth program operations of second non-adjacent memory cells belonging to the second portion from among the non-adjacent memory cells,
   wherein the second program operation includes a fifth program operation of a first adjacent memory cell and a sixth program operation of a second adjacent memory cell,
   wherein each of the fifth program operation and the sixth program operation includes a 1-step program operation and a 2-step program operation, and
   wherein the row decoder and the page buffer are further configured to:
      complete one of the third program operations and the fourth program operations;
      perform the 1-step program operation of each of the fifth and sixth program operations;
      complete the others of the third program operations and the fourth program operations; and
      then perform the 2-step program operation of each of the fifth and sixth program operations.

7. The nonvolatile memory device of claim 1, wherein the pillar further comprises a third portion stacked on the second portion,
   wherein at least a portion of a width of the third portion increases as a distance from the substrate increases, and third conductive materials and third insulating layers surround the third portion and are stacked in turn on the substrate,
   wherein a second boundary is located between the second portion and the third portion, and
   wherein the third conductive materials form third memory cells together with the third portion.

8. A storage device comprising:
   a nonvolatile memory device including a plurality of memory blocks; and
   a controller configured to control a write operation for a selected memory block of the memory blocks of the nonvolatile memory device, wherein each of the memory blocks comprises:
first memory cells corresponding to a first portion of a pillar extending in a direction perpendicular to a substrate; and
second memory cells corresponding to a second portion of the pillar extending in the direction perpendicular to the substrate and disposed on the first portion,
wherein the first memory cells and the second memory cells are classified into at least one first adjacent memory cell adjacent to a first boundary between the first portion and the second portion and first non-adjacent memory cells being remaining memory cells other than the at least one first adjacent memory cell,
wherein, in the write operation of the selected memory block, the controller controls the nonvolatile memory device such that the number of bits to be written in the at least one first adjacent memory cell is equal to or smaller than the number of bits to be written in each of the first non-adjacent memory cells when program operations of the first memory cells and the second memory cells are completed.

9. The storage device of claim 8, wherein the at least one first adjacent memory cell includes a memory cell closest to the first boundary from among the first memory cells.

10. The storage device of claim 8, when performing program operations based on consecutive addresses in a selected memory block of the memory blocks, the row decoder and the page buffer are configured to complete a second program operation of the at least one first adjacent memory cell after sequentially completing first program operations of the first non-adjacent memory cells,
wherein the first program operations include third program operations of non-adjacent memory cells belonging to the first portion from among the first non-adjacent memory cells and fourth program operations of non-adjacent memory cells belonging to the second portion from among the first non-adjacent memory cells,
wherein the second program operation includes a 1-step program operation and a 2-step program operation, and
wherein the row decoder and the page buffer are further configured to:
complete one of the third program operations and the fourth program operations;
perform the 1-step program operation;
complete the other of the third program operations and the fourth program operations; and
then perform the 2-step program operation.

11. The storage device of claim 8, wherein the at least one first adjacent memory cell includes a memory cell closest to the first boundary from among the second memory cells.

12. The storage device of claim 8, wherein the at least one first adjacent memory cell includes a memory cell closest to the first boundary from among the first memory cells and a memory cell closest to the first boundary from among the second memory cells.

13. The storage device of claim 12, when performing program operations based on consecutive addresses in a selected memory block of the memory blocks, the nonvolatile memory device is configured to complete a second program operation of the first adjacent memory cell after sequentially completing first program operations of the first non-adjacent memory cells,
wherein the first program operations include third program operations of non-adjacent memory cells belonging to the first portion from among the first non-adjacent memory cells and fourth program operations of non-adjacent memory cells belonging to the second portion from among the first non-adjacent memory cells,
wherein the second program operation includes a fifth program operation of the memory cell closest to the first boundary from among the first memory cells and a sixth program operation of the memory cell closest to the first boundary from among the second memory cells,
wherein each of the fifth program operation and the sixth program operation includes a 1-step program operation and a 2-step program operation, and
wherein the nonvolatile memory device is further configured to:
complete one of the third program operations and the fourth program operations;
perform the 1-step program operation of each of the fifth and sixth program operations;
complete the others of the third program operations and the fourth program operations; and
then perform the 2-step program operation of each of the fifth and sixth program operations.

14. The storage device of claim 8, wherein the pillar further comprises a third portion stacked on the second portion,
wherein at least a portion of a width of the third portion increases as a distance from the substrate increases, and third conductive materials and third insulating layers surround the third portion and are stacked in turn on the substrate,
wherein a second boundary is located between the second portion and the third portion, and
wherein the third conductive materials form third memory cells together with the third portion.

15. An operating method of a nonvolatile memory device including memory cells connected in series between a string selection transistor and a ground selection transistor, the method comprising:
completing first program operations of first memory cells of the memory cells; and
completing a second program operation of at least one second memory cell located between the first memory cells, after completing the first program operations of the first memory cells,
wherein the memory cells are stacked in a direction perpendicular to a substrate, based on a first portion of a pillar extending in the direction perpendicular to the substrate and a second portion of the pillar extending in the direction perpendicular to the substrate and disposed on the first portion, and
wherein the at least one second memory cell is more adjacent to a boundary between the first portion and the second portion than the first memory cells.

16. The operating method of claim 15, wherein the at least one second memory cell includes a memory cell closest to the boundary in the first portion.

17. The operating method of claim 15, wherein the first program operations include third program operations of first non-adjacent memory cells belonging to the first portion from among the first memory cells and fourth program operations of second non-adjacent memory cells belonging to the second portion from among the first memory cells,
wherein the second program operation includes a 1-step program operation and a 2-step program operation, and
wherein the completing first program operations comprises:

completing one of the third program operations and the fourth program operations; and then completing the other of the third program operations and the fourth program operations, wherein the completing second program operation comprises:

performing the 1-step program operation after the completing one of the third program operations and the fourth program operations; and then performing the 2-step program operation after the completing the other of the third program operations and the fourth program operations.

18. The operating method of claim 15, wherein the at least one second memory cell includes a memory cell closest to the boundary in the second portion.

19. The operating method of claim 15, wherein the second memory cell includes a first adjacent memory cell closest to the boundary in the first portion and a second adjacent memory cell closest to the boundary in the second portion.

20. The operating method of claim 18, wherein the first program operations include third program operations of first non-adjacent memory cells belonging to the first portion from among the first memory cells and fourth program operations of second non-adjacent memory cells belonging to the second portion from among the first memory cells, wherein the second program operation includes a fifth program operation of the first adjacent memory cell and a sixth program operation of the second adjacent memory cell, wherein each of the fifth program operation and the sixth program operation includes a 1-step program operation and a 2-step program operation, and wherein the completing first program operations comprises:

completing one of the third program operations and the fourth program operations; and then completing the others of the third program operations and the fourth program operations, wherein the completing second program operation comprises:

performing the 1-step program operation of each of the fifth and sixth program operations after the completing one of the third program operations and the fourth program operations; and then performing the 2-step program operation of each of the fifth and sixth program operations after the completing the others of the third program operations and the fourth program operations.

* * * * *